United States Patent [19]
Kato et al.

[11] Patent Number: 5,838,449
[45] Date of Patent: Nov. 17, 1998

[54] OPTICAL APPARATUS

[75] Inventors: Kinya Kato; Masaki Kato; Kei Nara, all of Yokohama, Japan

[73] Assignee: Nikon Corporation, Japan

[21] Appl. No.: 912,954

[22] Filed: Aug. 14, 1997

Related U.S. Application Data

[63] Continuation of Ser. No. 565,805, Nov. 30, 1995, abandoned.

[30] Foreign Application Priority Data

| Dec. 1, 1994 | [JP] | Japan | 6-323924 |
| Dec. 1, 1994 | [JP] | Japan | 6-323927 |
| Dec. 1, 1994 | [JP] | Japan | 6-323929 |

[51] Int. Cl.⁶ .................................................. G01B 9/02
[52] U.S. Cl. .......................... 356/399; 356/363; 250/548
[58] Field of Search .................................. 356/399, 400, 356/401, 363; 750/548

[56] References Cited

U.S. PATENT DOCUMENTS

| 4,112,309 | 9/1978 | Nakazawa et al. . |
| 4,611,122 | 9/1986 | Nakano et al. . |
| 4,669,883 | 6/1987 | Ina et al. . |
| 4,895,447 | 1/1990 | Jarisch et al. ............................ 356/363 |

OTHER PUBLICATIONS

Becker, et al., "A High Resolution Dimensional Metrology System For Masks", Integrated Circuit Metrology, Inspection, and Process Control, 1987, vol. 775, pp. 120–125.

*Primary Examiner*—Robert Kim
*Attorney, Agent, or Firm*—Pennie & Edmonds LLP

[57] ABSTRACT

An exposure apparatus of a large-substrate single scan-exposure type by which a mask mark and a plate mark are two-dimensionally scanned in relatively narrow respective scan areas at the same time to effect highly accurate alignment. In the present invention, a first substrate and a second substrate are relatively moved in a predetermined direction with respect to a projection optical system, while an image of a pattern formed in the first substrate projectively impinges on the second substrate by way of the projection optical system. The projection optical system comprises a plurality of projection optical units arranged in a direction orthogonal to the scanning direction in order to form, on the second substrate, a same-magnification erected image of the pattern formed on the first substrate. The exposure apparatus has an alignment means for detecting a first mark formed on the first substrate and a second mark formed on the second substrate by optical scanning so as to measure a positional deviation between the first substrate and the second substrate.

21 Claims, 17 Drawing Sheets

OPTICAL APPARATUS

This is a continuation of application Ser. No. 08/565,805, filed Nov. 30, 1995, now abandoned.

BACKGROUND OF THE INVENTION

1. Field of the Invention

The present invention relates to an optical apparatus and, in particular to alignment of a large mask with a large plate in a scanning type exposure apparatus using a plurality of projection optical units.

2. Related Background Art

In recent years, liquid crystal display panels have often been used as display elements in word processors, personal computers, televisions, and the like. The liquid display panel is made when a transparent thin film electrode is patterned into a desired form on a glass substrate by a photolithography technique. As an apparatus for such a lithography technique, there has been used an exposure apparatus in which an original image pattern formed on a mask projectively impinges on a photoresist layer on the glass substrate (plate) by way of a projection optical system.

Meanwhile, there has recently been a demand for larger liquid crystal display panels and, accordingly, enlargement of exposure area has been desired.

In order to respond to such a demand for enlarging the exposure area, there has been proposed a scanning type exposure apparatus in which a projection optical system is constituted by a plurality of projection optical units and a large mask and a large plate are relatively moved with respect to the projection optical system so as to be exposed to light (Japanese Unexamined Patent Publication Hei No. 7-57986). In this exposure apparatus, each projection optical unit forms, on the plate, a same-magnification erected image of a pattern which has been formed in the mask.

Since the projection optical system is constituted by a plurality of projection optical units, the above-mentioned exposure apparatus has an advantage that a large exposure area can be scanned and illuminated at once by the projection optical units as a whole even when each unit has a small size.

In order to perform scanning and exposure with a high accuracy while relatively moving the large mask and large plate with respect to the projection optical system comprising a plurality of projection optical units, a mark formed in the mask (i.e., mask mark) and a mark formed in the plate (i.e., pattern mark) have to be individually detected so as to two-dimensionally effect relative positioning (i.e., alignment) of the mask and the plate with each other with accuracy.

In the conventional method of detecting such a mark, for example, as described in Japanese Patent Publication Hei No. 1-41249, two marks which are substantially orthogonal to each other are scanned with two linear beams which are separated from each other and then the scattered light components from the marks are received so as to measure relative positions of the marks with respect to each other.

Also, for example, as described in Japanese Patent Publication Hei No. 1-17245, there has been known a method in which intersecting beams scan marks whose directions are different from each other and then the scattered light components from the marks are received after being separated by polarization or the like.

SUMMARY OF THE INVENTION

The present invention relates to an exposure apparatus in which a first substrate and a second substrate are relatively moved in a predetermined direction with respect to a projection optical system, while an image of a pattern formed in the first substrate projectively impinges on the second substrate by way of the projection optical system. The projection optical system comprises a plurality of projection optical units arranged in a direction orthogonal to a scanning direction in order to form, on the second substrate, a same-magnification erected image of the pattern formed on the first substrate. The exposure apparatus has an alignment means for detecting a first mark formed on the first substrate and a second mark formed on the second substrate by optical scanning so as to measure a positional deviation between the first substrate and the second substrate. The alignment means comprises a light source means for supplying a luminous flux; a scan beam forming optical system for forming two spatially-separated scan beams in a visual field area on the first substrate with respect to a specific projection optical unit in the plurality of the projection optical units; a scanning means for optically scanning, in directions different from each other, the two beams formed on the first substrate; a first detection means for detecting a light component from the first mark generated by optical scanning with one of the two scan beams formed on the first substrate and a light component from the second mark generated by optical scanning with that one scan beam formed on the second substrate by way of the specific projection optical unit; and a second detection means for detecting a light component from the first mark generated by optical scanning with the other of the two scan beams formed on the first substrate and a light component from the second mark generated by optical scanning with that other scan beam formed on the second substrate by way of the specific projection optical unit.

Preferably, the scan beam forming optical system forms two linear beams, which are orthogonal to each other in their longitudinal directions, on the first substrate and the scanning means scans the two linear beams in directions orthogonal to their longitudinal directions, respectively.

Preferably, the scan beam forming optical system forms two spatially-separated scan beams in each of two visual field areas on the first substrate with respect to two of the plurality of the projection optical units which are respectively positioned at both ends in a direction orthogonal to the scanning direction.

In the exposure apparatus in accordance with the present invention, the mask and the plate are relatively moved with respect to the projection optical system constituted by a plurality of the projection optical units for forming, on the plate, the same-magnification erected image of the pattern formed in the mask, thereby scanning the exposure light and transferring the pattern to the plate. Then, the mask mark and the plate mark are optically scanned in a two-dimensional manner to effect alignment.

Specifically, for example, two spatially-separated linear beams which are orthogonal to each other in their longitudinal directions are formed on the mask, while two spatially-separated linear beams which are same-magnification erected images of the two linear beams on the mask are formed on the plate by way of a specific projection optical unit.

Each of the two linear beams is movable in a direction orthogonal to the longitudinal direction of the mark. Accordingly, the mask mark and the plate mark can be simultaneously scanned with the two linear beams respectively in two directions orthogonal to each other.

Namely, in accordance with the present invention, a component of the mark in a scanning direction is scanned with one of linear beams, while a component of the mark in a direction orthogonal to that direction is scanned with the other linear beam, thereby enabling concurrent two-dimensional scanning. Also, while concurrent two-dimensional scanning is performed, the detected light components from the individual directional components of the mark are spatially separated from each other, they are photoelectrically detected without mingling with each other. Accordingly, a relatively narrow scanning range may be subjected to concurrent two-dimensional scanning to effect alignment with a high accuracy.

Also, the present invention relates to a pattern detection apparatus comprising a light source means for supplying a luminous flux; a condenser optical system for converging the luminous flux on a test surface in which a pattern has been formed; a scanning means disposed in an optical path between the light source means and the condenser optical system so as to optically scan the test surface with the luminous flux thereon; and a detection means for detecting a light component from the pattern generated when the test surface is optically scanned with the luminous flux thereon. The scanning means comprises a movable reflection means which has at least two reflective surfaces orthogonal to each other so as to emit, with a polarization of 180 degrees, the luminous flux input from the light source means and parallelly dislocates the emitted luminous flux in a predetermined direction with respect to the incident luminous flux and a measurement means for measuring an amount of movement, in the predetermined direction, concerning a point of intersection between a line of intersection formed by at least two reflective surfaces of the movable reflection means and a plane including the incident luminous flux and emitted luminous flux with respect to at least two reflective surfaces of the movable reflection means. In order to form two spatially-separated scanning luminous fluxes on the test surface, a two-luminous-flux generating means for generating, based on the emitted luminous flux from the movable reflection means, two spatially-separated luminous fluxes which are under polarizing conditions different from each other is disposed in an optical path between the scanning means and the condenser optical system. The detection means photoelectrically detects light components from the pattern passing through the condenser optical system, the two-luminous-flux generating means, and the movable reflection means by way of two openings fixed at positions which are optically conjugate with the test surface, respectively.

Preferably, the measurement means comprises a second light source means for supplying a measuring luminous flux; a second movable reflection means which has at least two reflective surfaces orthogonal to each other so as to emit, with a polarization of 180 degrees, the measuring luminous flux input from the second light source means and is movable in the predetermined direction together with the movable reflection means and a measuring means for measuring, based on change in the optical path length of the measuring luminous flux accompanying the movement of the second movable reflection means, an amount of movement, in the predetermined direction, concerning a point of intersection between a line of intersection formed by at least two reflective surfaces of the second movable reflection means and a plane including the incident luminous flux and emitted luminous flux with respect to at least two reflective surfaces of the second movable reflection means, while the point of intersection in the second movable reflection means substantially coincides with the point of intersection in the movable reflection means.

The pattern detection apparatus in accordance with the present invention has, as a scanning means, the movable reflection means (e.g., movable reflection mirror) having at least two reflective surfaces orthogonal to each other. The amount of movement of the point of intersection (simply referred to as "reflecting intersection" in the following) between the line of intersection of the reflective surfaces of the scanning movable reflection mirror and the plane including the incident beam and the emitted beam is measured, for example, by an interferometer. Accordingly, as will be explained later, even when there occurs locus fluctuation in linear reciprocating movement of the scanning movable reflection mirror, the amount of parallel dislocation of the beam due to the scanning movable mirror as well as the amount of movement of the scan beam on the test surface can be accurately determined on the basis of the measured amount of movement of the reflecting intersection. As a result, the pattern can be detected with a high accuracy.

Also, in accordance with the present invention, from the luminous flux from the scanning movable reflection mirror, two spatially-separated luminous fluxes which are under polarizing conditions different from each other are generated. These two luminous fluxes are converged, by way of the condenser optical system, on the test surface where two spatially-separated scan beams are formed. Accordingly, concurrent two-dimensional scanning is enabled on the test surface with the two scan beams, while two pattern detecting light components are photoelectrically detected without mingling with each other. Further, due to a polarizing effect, loss in the amount of light can be minimized. As a result, the pattern can be detected with a high speed and a high accuracy.

In accordance with the present invention, the pattern detecting light component from the test surface re-enters the movable reflection mirror and then is photoelectrically detected by way of an opening such as a slit fixed at a position which is conjugate with the test surface. In this manner, by re-entering the movable reflection mirror, the pattern detecting light component is placed under an apparently still condition even during scanning. Namely, a position at which the pattern detecting light component forms an image on a plane conjugate with the test surface is always constant. In this manner, since a so-called cofocusing of detection means becomes possible, the present invention enables pattern detection with a good S/N and a high accuracy.

Further, the present invention relates to a scanning optical apparatus comprising a light source means for supplying a luminous flux; a condenser optical system for converging the luminous flux on a test surface in which a pattern has been formed; and a scanning means which is disposed in an optical path between the light source means and the condenser optical system so as to optically scan the test surface with the luminous flux thereon. The scanning means comprises a movable reflection means which has at least two reflective surfaces orthogonal to each other so as to emit, with a polarization of 180 degrees, the incident luminous flux from the light source means and parallelly dislocates the emitted luminous flux in a predetermined direction with respect to the incident luminous flux and a measurement means for measuring an amount of movement, in the predetermined direction, concerning a point of intersection between a line of intersection formed by at least two reflective surfaces of the movable reflection means and a plane including the incident luminous flux and emitted luminous flux with respect to at least two reflective surfaces of the movable reflection means.

Preferably, the measurement means comprises a second light source means for supplying a measurement luminous flux; a second movable reflection means which has at least two reflective surfaces orthogonal to each other so as to emit, with a polarization of 180 degrees, the incident measurement luminous flux from the second light source means and is movable in the predetermined direction together with the movable reflection means and a measuring means for measuring, based on change in the optical path length of the measurement luminous flux accompanying the movement of the second movable reflection means, an amount of movement, in the predetermined direction, concerning a point of intersection between a line of intersection formed by at least two reflective surfaces of the second movable reflection means and a plane including the incident luminous flux and emitted luminous flux with respect to at least two reflective surfaces of the second movable reflection means, while the point of intersection in the second movable reflection means substantially coincides with the point of intersection in the movable reflection means.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the conventional mark-detecting techniques such as those mentioned above, it is difficult for scattered light components from two marks, whose directions are different from each other, to be optically detected as being completely separated from each other. Also, in the conventional mark-detecting techniques such as those mentioned above, scanning is necessary in a relatively wide area.

Accordingly, when the conventional mark-detecting techniques are applied to an exposure apparatus of a type in which a large substrate is scanned at once, such as that mentioned above, highly accurate alignment cannot be effected by scanning within a relatively narrow area.

In accordance with the present invention, on the other hand, the mask mark and the plate mark can be two-dimensionally scanned at the same time at their relatively narrow respective scanning areas, thereby effecting alignment with a high accuracy.

In the following, embodiments of the present invention will be explained with reference to the attached drawings.

Figure 1:
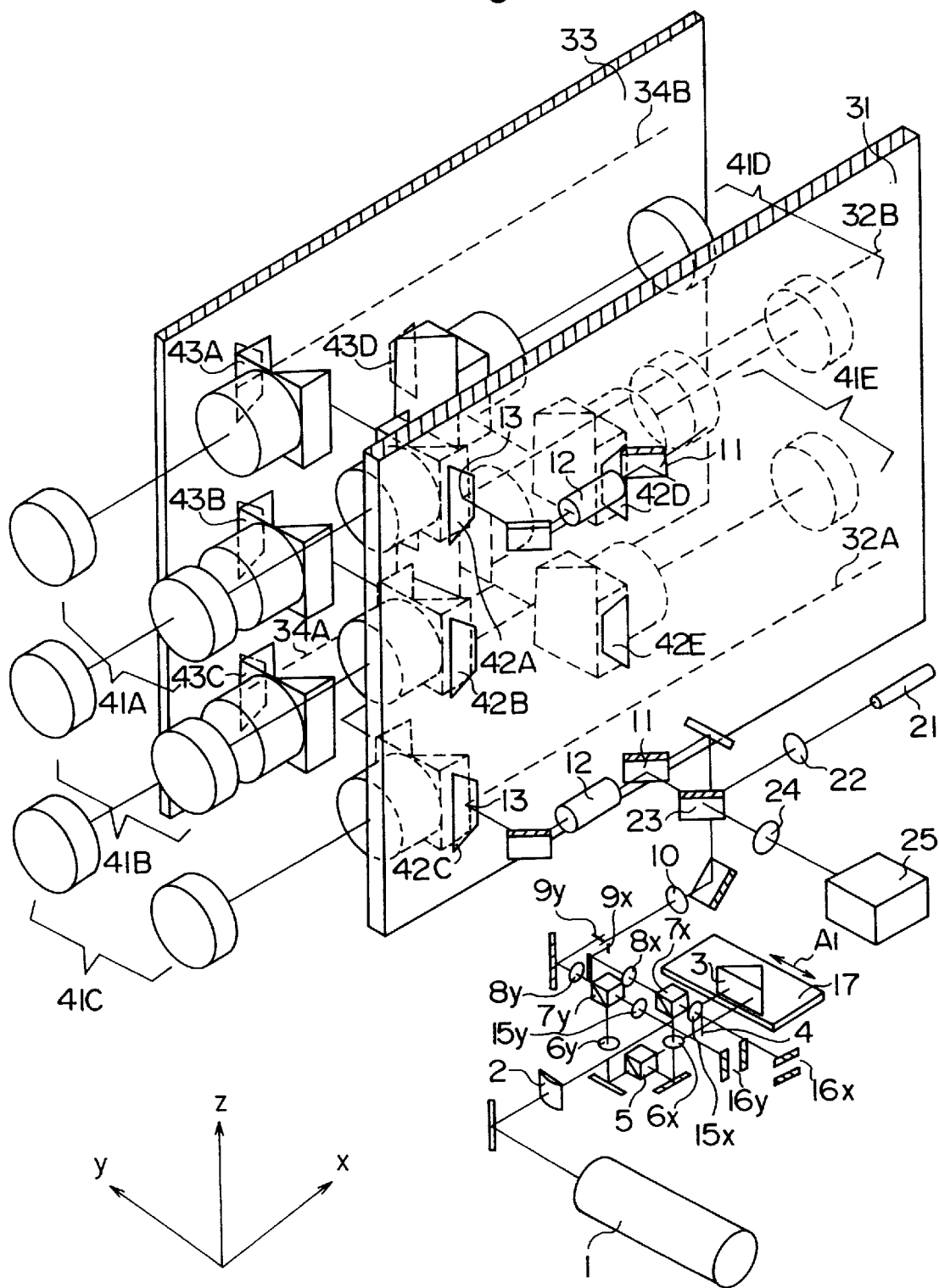
FIG. 1 is a perspective view schematically showing the constitution of an exposure apparatus in accordance with an embodiment of the present invention.

FIG. 1 is a perspective view schematically showing the constitution of an exposure apparatus in accordance with an embodiment of the present invention.

In the apparatus of FIG. 1, x-direction refers to a direction in which a mask 31, in which a predetermined circuit pattern has been formed, and a plate 33 comprising a glass substrate coated with a resist are moved unitedly, z-direction refers to a direction orthogonal to the x-direction within the plane of the mask 31, and y-direction refers to a direction of a normal with respect to the plane of the mask 31.

In FIG. 1, exposure light from an illumination optical system not shown in this drawing uniformly illuminates the mask 31. Then, the patterns formed at trapezoid visual field areas 42A to 42E are respectively transferred, by way of same-magnification erect projection optical systems 41A to 41E, to trapezoid areas 43A to 43E (43E being not depicted). Accordingly, when the mask 31 and the plate 33 are exposed to light while being unitedly moved relative to the x-direction, the whole pattern area of the mask can be transferred to the whole exposure area of the plate.

As each projection optical system, as described in the above-mentioned Japanese Unexamined Patent Publication Hei No. 7-57986, so-called Dyson type optical systems or Offner type optical systems may be used in two sets.

Also, the apparatus of FIG. 1 has an alignment optical system for effecting two-dimensional alignment of the mask 31 with the plate 33 within xz-plane. In the alignment optical system, by way of the projection optical systems 41A and 41C positioned at both ends in the direction orthogonal to the scanning direction (i.e., z-direction), the relative positions of the mask mark and plate mark with respect to each other are detected.

When each projection optical system is constituted by two sets of Dyson type optical systems or two sets of Offner type optical systems, chromatic aberration in each projection optical system is small. Accordingly, even when alignment is effected by using an alignment light component having a non-exposed wavelength, correction optical systems for chromatic aberration and the like are unnecessary.

FIG. 1 shows the overall constitution of the first alignment optical system corresponding to the visual field area 42C (and projection optical system 41C), while showing only a part of the second alignment optical system corresponding to the visual field area 42A (and projection optical system 41A). Since the two alignment optical system have the same constitution, the constitution of the first alignment optical system will be explained in the following.

Figure 2:
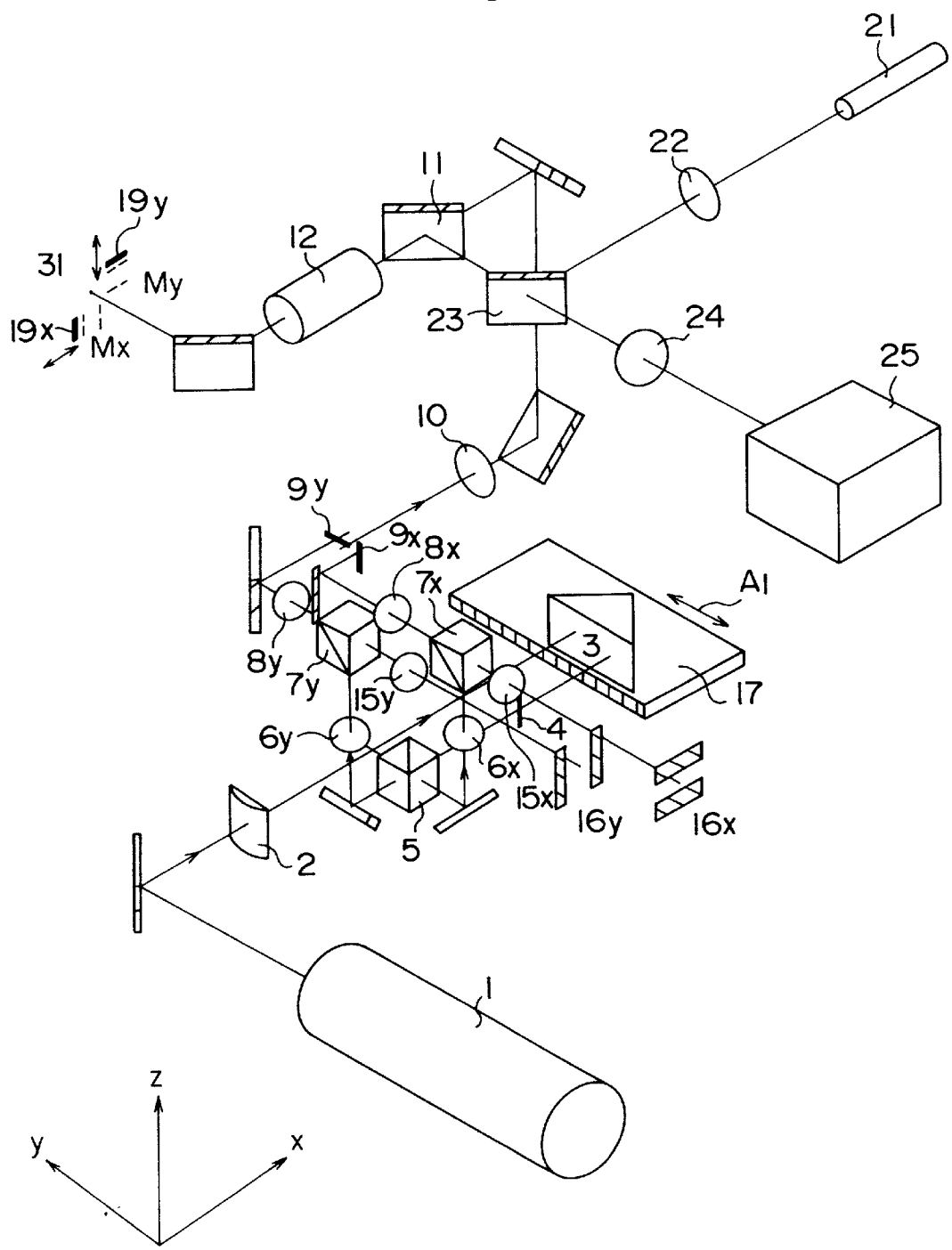
FIG. 2 is an enlarged view showing the constitution of the alignment optical system shown in FIG. 1.

FIG. 2 is an enlarged view showing the constitution of the alignment optical system shown in FIG. 1. This alignment optical system has an observation optical system for observing the mask mark and the plate mark. In the observation optical system, light emitted from a light guide 21 such as optical fiber passes through a collector lens 22 and then is reflected by a half mirror 23 so as to enter a dichroic mirror 11. The light reflected by the dichroic mirror 11 illuminates, by way of an objective lens 12, mask marks Mx and My on the mask 31. The illuminating light further illuminates, by way of the projection optical system 41C, plate marks (not depicted) on the plate 33.

The light component from the plate marks with respect to the illuminating light re-enters the projection optical system 41C and then returns to the mask 31. Further, by way of the objective lens 12 and the dichroic mirror 11, it enters the half mirror 23. The light component passing through the half mirror 23 forms, by way of a second observation objective lens 24, an image on an image pickup element 25.

On the other hand, the light component from the mask marks Mx and My with respect to the illuminating light enters the half mirror 23 after passing through the objective lens 12 and the dichroic mirror 11. The light component passing through the half mirror 23 forms, by way of the second observation objective lens 24, an image on the image pickup element 25.

In this manner, by the observation optical system, the images of both mask marks Mx and My and plate marks can be observed simultaneously so as to detect their positions based on image processing.

The alignment optical system of FIG. 2 has a scanning optical system for two-dimensionally scanning the mask marks Mx and My and plate marks with linear beams. In the scanning optical system, the alignment light emitted from a laser 1 in the y-direction is reflected toward the x-direction by a mirror and then, by way of a cylindrical lens 2, turned into a linear beam extending in the z-direction. Preferably, a beam expander is disposed between the laser 1 and the cylindrical lens 2 when necessary.

The beam passing through the cylindrical lens 2 enters a rectangular prism 3. The beam incident on the rectangular prism 3 is reflected on two reflective surfaces, which are orthogonal to each other, and then emitted in parallel to the incident beam. The rectangular prism 3 has been fixed on a table which is in parallel to the xy-plane, while the table 17 is reciprocatively movable in the y-direction as indicated by arrow $A_1$ in the drawing.

In this manner, due to the condensing action of the above-mentioned cylindrical lens 2, the beam emitted from the rectangular prism 3 forms an image as a linear beam 4. As will be explained later, the linear beam 4 moves in the y-direction (i.e., in a parallel dislocation) in response to the movement of the table 17 in the y-direction.

The light from the linear beam 4 enters a half prism 5 and then is divided into two beams. Namely, by way of a relay lens 6x, a half prism 7x, and a relay lens 8x, the first beam reflected by the half prism 5 forms an image as a linear beam 9x whose longitudinal direction extends in the z-direction.

On the other hand, by way of a relay lens 6y, a half prism 7y, and a relay lens 8y, the second beam passing through the half prism 5 forms an image as a linear beam 9y whose longitudinal direction extends in the y-direction.

As depicted, the two linear beams 9x and 9y have longitudinal directions which are orthogonal to and separated from each other. Namely, the centers of the two linear beams 9x and 9y are individually deviated from the optical axis of a second objective lens 10 which will be explained later.

By way of the second objective lens 10, the dichroic mirror 11, and the objective lens 12, the light components from the two linear beams 9x and 9y respectively form images on the surface of the mask 31 as linear beams 19x and 19y.

As depicted, the linear beam 19x has a longitudinal direction extending in the z-direction, whereas the linear beam 19y has a longitudinal direction extending in the x-direction. Together with the reciprocative movement of the rectangular prism 3 in the y-direction, the linear beam 19x moves in the x-direction to scan the mask mark Mx, while the linear beam 19y moves in the z-direction to scan the mask mark My.

By way of the projection optical system 41C, on the other hand, the light components from the two linear beams 19x and 19y respectively form images on the surface of the plate 33 as linear beams 19'x and 19'y (not depicted).

As mentioned above, the projection optical system 41C is constructed so as to form, on the plate, a same-magnification erected image of the mask pattern. Accordingly, also on the plate 33, the linear beam 19'x has a longitudinal direction extending in the z-direction, whereas the linear beam 19'y has a longitudinal direction extending in the x-direction. Together with the reciprocative movement of the rectangular prism 3 in the y-direction, the linear beam 19'x moves in the x-direction to scan the plate mark Px (not depicted), while the linear beam 19'y moves in the z-direction to scan the plate mark Py (not depicted). The amount of movement of the linear beam 19 on the mask 31 accompanying the reciprocative movement of the rectangular prism 3 in the y-direction is equal to that of the linear beam 19' on the plate 33.

The first diffracted light component from the mask mark Mx with respect to the linear beam 19x enters the half prism 7x by way of the objective lens 12, the dichroic mirror 11, the objective lens 10, and the relay lens 8x.

Also, the second diffracted light component from the mask mark My with respect to the linear beam 19y enters the half prism 7y by way of the objective lens 12, the dichroic mirror 11, the objective lens 10, and the relay lens 8y.

By way of a relay lens 15x, the first diffracted light component passing through the half prism 7x reaches a spatial filter 16x, which is disposed at a position conjugate with the pupil surface of the objective lens 12, and then is photoelectrically detected. Also, by way of a relay lens 15y, the second diffracted light component passing through the half prism 7y reaches a spatial filter 16y, which is disposed at a position conjugate with the pupil surface of the objective lens 12, and then is photoelectrically detected.

On the other hand, by way of the projection optical system 41C, the objective lens 12, the dichroic mirror 11, the second objective lens 10, and the relay lens 8x, the third diffracted light component from the plate mark Px with respect to the linear beam 19'x enters the half prism 7x.

Also, by way of the projection optical system 41C, the objective lens 12, the dichroic mirror 11, the second objective lens 10, and the relay lens 8y, the fourth diffracted light component from the plate mark Py with respect to the linear beam 19'y enters the half prism 7y.

By way of the relay lens 15x, the third diffracted light component passing through the half prism 7x reaches the spatial filter 16x, which is disposed at a position conjugate with the pupil surface of the objective lens 12 and the pupil surface of the projection optical system 41C, and then is photoelectrically detected.

Also, by way of the relay lens 15y, the fourth diffracted light component passing through the half prism 7y reaches the spatial filter 16y, which is disposed at a position conjugate with the pupil surface of the objective lens 12 and the pupil surface of the projection optical system 41C, and then is photoelectrically detected.

Further, the apparatus of FIG. 1 has a measurement means (not depicted) for measuring the amount of movement $\Delta$ of the table 17 or rectangular prism 3 in the y-direction. As the measurement means, for example, an interferometer, an encoder, or the like may be used.

Figure 3:
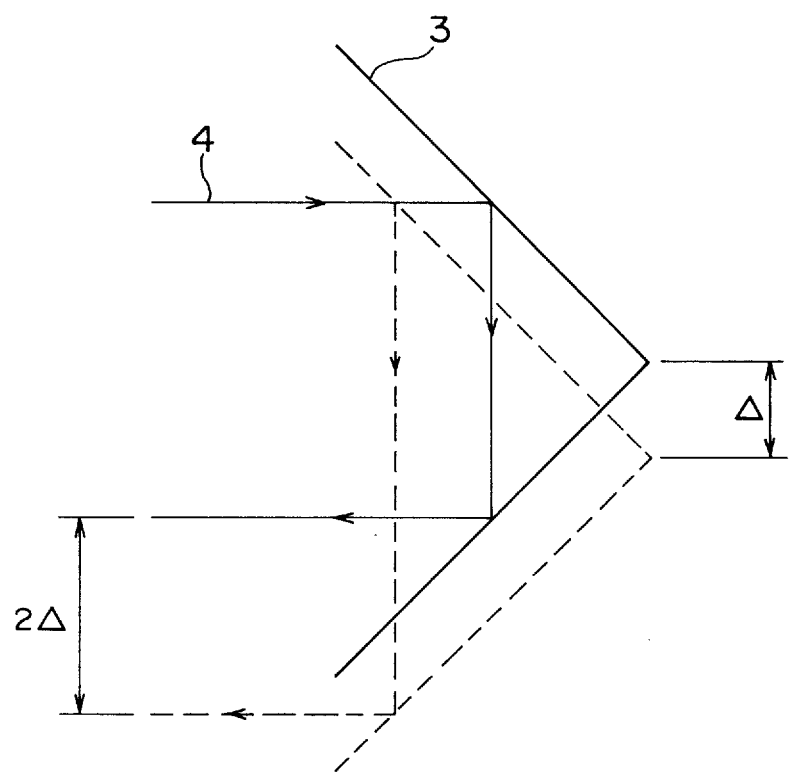
FIG. 3 is a drawing showing the relationship between the movement of a rectangular prism and the amount of parallel dislocation of a linear beam caused thereby.

As shown in FIG. 3, when the table 17 and, accordingly, the rectangular prism 3 parallelly move in the y-direction by $\Delta$, the linear beam 4 is parallelly dislocated by $2\Delta$ due to the action of the rectangular prism 3. When the magnification of the optical system is taken as $\beta$, the amount of movement $\delta$ of the linear beam 19 on the mask or that of the linear beam 19' on the plate is expressed by the following equation (1):

$$\delta = 2\Delta/\beta \quad (1)$$

Accordingly, when the amount of movement $\Delta$ of the table 17 or rectangular prism 3 in the y-direction is measured, the amount of movement of the linear beam 4 can be accurately determined on the basis of thus measured value. Namely, since the scanning position can be obtained accurately, beam scanning can be performed with a high accuracy.

However, there may be a case where locus fluctuation such as rotation occurs in the locus of movement of the rectangular prism 3 due to driving error in driving means for the table 17. In such a case, the amount of parallel dislocation of the rectangular prism 3 and, accordingly, the amount of movement of the linear beam 4 cannot be accurately determined even when the amount of movement of a specific position on the table 17 in the y-direction is measured.

In the following, the relationship between the amount of movement (including rotation) of the rectangular prism 3 and the amount of parallel dislocation of the beam 4 caused by the action of the rectangular prism 3 will be explained.

Figure 4:
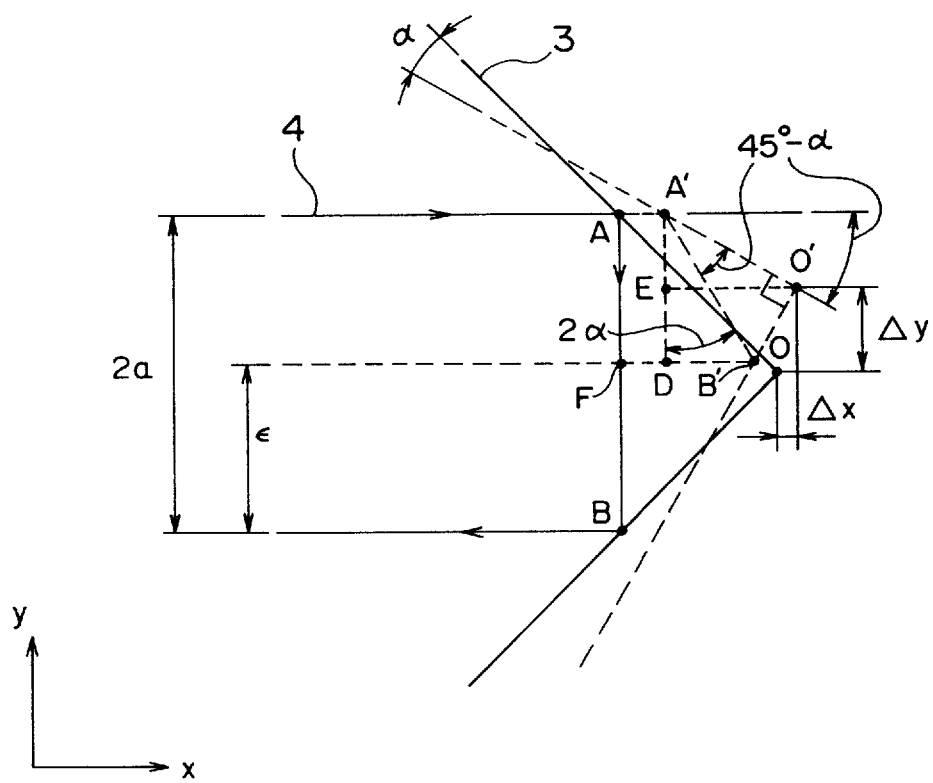
FIG. 4 is a drawing showing the relationship between the rotation of a rectangular prism or the like and the amount of parallel dislocation of a beam.

FIG. 1 is a drawing showing the relationship between the amount of movement of the rectangular prism 3 and the amount of parallel dislocation of the beam. As shown in FIG. 4, it is assumed that the point of intersection (i.e., reflecting intersection) O between the line of intersection of the reflective surfaces of the rectangular prism 3 and the plane including the incident beam and emitted beam has reached a point O' by moving $\Delta x$ in the x-direction and $\Delta y$ in the y-direction, while rotating counterclockwise by a minute angle $\alpha$.

In the drawing, the reflective surface before movement and the reflective surface after movement are indicated by continuous line and broken line, respectively. Also, in the drawing, the beam locus with respect to the reflective surface before movement and the beam locus with respect to the reflective surface after movement are indicated by continuous line and broken line, respectively.

First, the beam incident on a point A at an angle of 45° (in the horizontal direction in the drawing) with respect to the first reflective surface is reflected vertically downward in the drawing and then impinges on a point B at an angle of 45° with respect to the second reflective surface. The beam incident on the point B in the second reflective surface is reflected horizontally leftward in the drawing. In this manner, the beam distance between the incident beam and reflected beam becomes a distance $2a$ between the point A and point B in the y-direction.

Also, the beam introduced in the horizontal direction in the drawing in the same manner is reflected at a point A' in the first reflective surface after movement by way of the point A and then impinges on a point B' in the second reflective surface. The beam incident on the point B' in the second reflective surface after movement is reflected horizontally leftward in the drawing. In this manner, the reflected beam from the rectangular prism 3 after movement is parallelly dislocated with respect to the reflected beam from the rectangular prism 3 before movement by $\epsilon$ in the y-direction.

The amount of parallel dislocation $\epsilon$ is expressed by the following equation (2):

$$\begin{aligned}\epsilon &= 2a - A'D \\ &= 2a - A'B'\cos 2\alpha\end{aligned} \quad (2)$$

Since the angle O'A'B' is $45° - \alpha$, A'B' is expressed by the following equation (3):

$$\begin{aligned}A'B' &= A'O'/\cos(45° - \alpha) \\ &= 2^{1/2}A'O'/(\cos\alpha + \sin\alpha)\end{aligned} \quad (3)$$

Also, A'O' is expressed by the following equation (4):

$$\begin{aligned}A'O' &= A'E/\sin(45° - \alpha) \\ &= 2^{1/2}(a - \Delta y)/(\cos\alpha - \sin\alpha)\end{aligned} \quad (4)$$

Based on the above-mentioned equations (2) to (4), a relationship expressed by the following equation (5) is established:

$$\epsilon = 2a - 2(a - \Delta y) = 2\Delta y \quad (5)$$

In this manner, it is understood from equation (5) that the amount of parallel dislocation $\epsilon$ of the beam can be obtained, independent of the rotation angle $\alpha$ of the rectangular prism 3 and its amount of movement $\Delta x$ in the direction parallel to the incident beam, when the amount of dislocation $\Delta y$ of the reflected beam in the direction of parallel dislocation (i.e., direction perpendicular to the incident beam) is measured.

Thus, the amount of movement $\Delta$ of the reflecting intersection of the rectangular prism 3 in the y-direction is preferably measured by an appropriate measurement means, since the amount of movement δ of the scan beam on the mask or plate, which is a test surface, can be accurately determined on the basis of the amount of movement Δ. Namely, when only the amount of movement Δ of the reflecting intersection of the rectangular prism 3 in the y-direction is taken into consideration, the position of scan beam on the test surface can be accurately determined even when locus fluctuation such as rotation occurs in the movement of the rectangular prism 3, thereby enabling highly accurate beam scanning.

The amount of movement Δ can be measured by a mechanical method such as a linear type encoder etc. or an optical method such as an interferometer etc. In the following, measurement by using an interference optical system will be explained.

Figure 5:
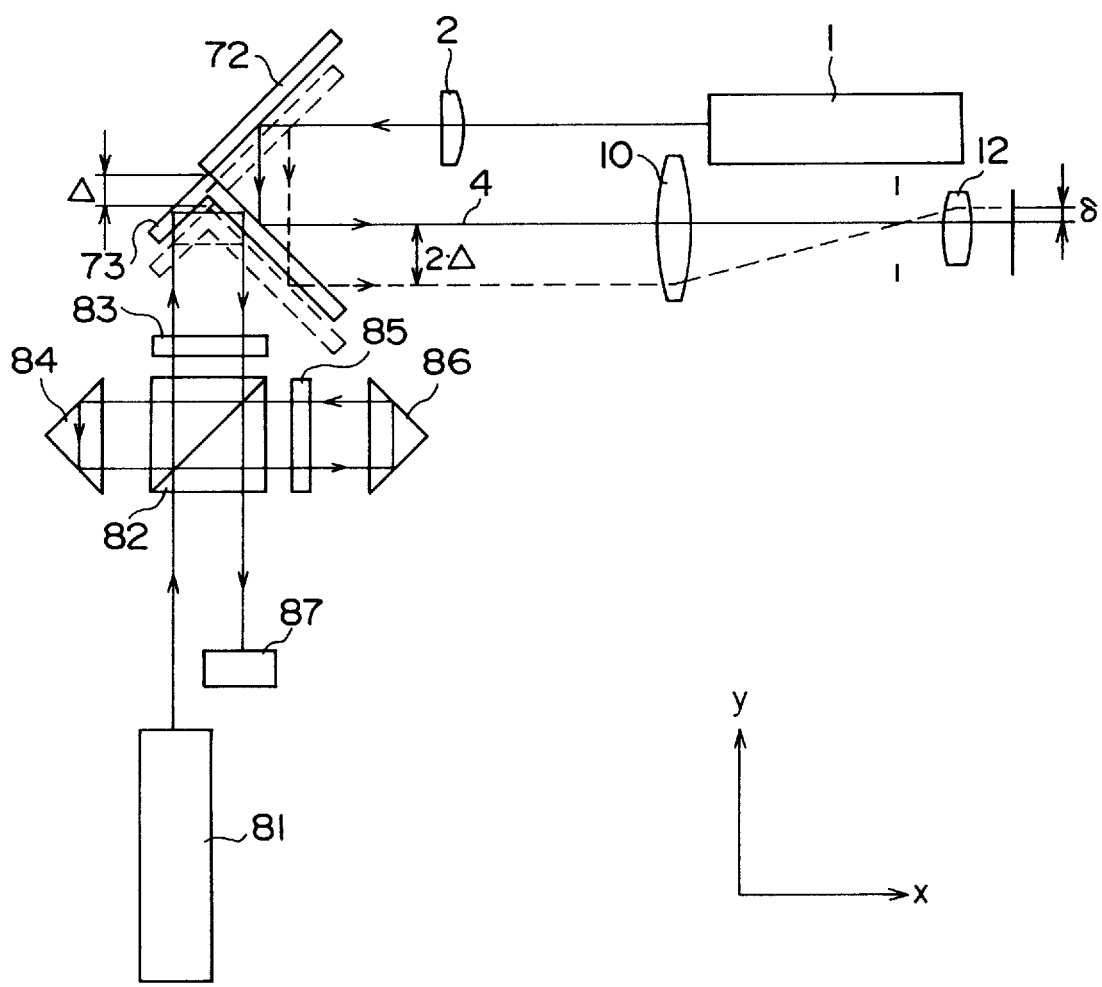
FIG. 5 is a drawing showing an example in which a movable reflection mirror is used in place of the rectangular prism in FIG. 2 and an interference optical system having a movable rear reflection mirror is used for measuring the amount of movement of the reflecting intersection of the movable reflection mirror.

FIG. 5 is a drawing showing an example in which a movable reflection mirror is used in place of the rectangular prism 3 in FIG. 2 and an interference optical system having a movable rear reflection mirror is used for measuring the amount of movement of the reflecting intersection of the movable reflection mirror.

In the depicted constitution, a movable reflection mirror 72 having two orthogonal reflective surfaces is used in place of the prism 3 in FIG. 2. The movable reflection mirror 72 comprises a first reflective surface, which is at an angle of 45° with respect to the incident beam in the x-direction and orthogonal to the xy-plane, and a second reflective surface which is orthogonal to the first reflective surface and xy-plane. As in the case of the rectangular prism 3 in FIG. 2, the movable reflection mirror 72 is fixed on the table 17 and is reciprocatively movable in the y-direction.

In FIG. 5, as a means for measuring the amount of movement Δ of the reflecting intersection of the movable reflection mirror 72, an interference optical system is provided. In the interference optical system, a beam emitted from a laser 81 is divided by a polarizing beam splitter 82 into a first beam directed to a movable rear reflection mirror 73 and a second beam directed to a rectangular prism 86 which is a fixed mirror.

The movable rear reflection mirror 73 comprises a first reflective surface, which is at an angle of 45° with respect to the incident beam in the y-direction and orthogonal to the xy-plane, and a second reflective surface which is orthogonal to the first reflective surface and xy-plane. Also, the movable rear reflection mirror 73 is fixed on the table 17, while the reflecting intersection of the movable rear reflection mirror 73 coincides with that of the movable reflection mirror 72.

The first beam directed to the movable rear reflection mirror 73 by way of the polarizing beam splitter 82 impinges on the movable rear reflection mirror 73 by way of a ¼-wavelength plate 83. The first beam incident on the movable rear reflection mirror 73 is reflected by its first and second reflective surfaces and then re-enters the polarizing beam splitter 82 by way of the ¼-wavelength plate 83.

On the other hand, the second beam directed, by way of the polarizing beam splitter 82, to the rectangular prism 86, which is a fixed reflection mirror, enters the rectangular prism 86 by way of a ¼-wavelength plate 85. The second beam incident on the rectangular prism 86 is reflected by its two reflective surfaces and then re-enters the polarizing beam splitter 82 by way of the ¼-wavelength plate 85.

The first beam input from the movable rear reflection mirror 73 is reflected by the polarizing beam splitter 82. The second beam input from the rectangular prism 86 passes through the polarizing beam splitter 82. Namely, the first and second beams incident on the polarizing beam splitter 82 are combined together and then enter a cube corner 84. The two beams reversed at the cube corner 84 re-enter the polarizing beam splitter 82.

Thereafter, the first beam is reflected by the polarizing beam splitter 82 and then, by way of the ¼-wavelength plate 83, impinges on the movable rear reflection mirror 73 again. The first beam incident on the movable rear reflection mirror 73 is reflected by its first and second reflective surfaces and then, by way of the ¼-wavelength plate 83, re-enters the polarizing beam splitter 82.

In place of the scanning movable reflection mirror 72 and measuring movable reflection mirror 73 in FIG. 5, cube corner mirror having three reflective surfaces which are orthogonal to each other may be used. In this case, two sets of the cube corner mirrors may preferably be disposed such that their apexes overlap with each other.

On the other hand, the second beam passes through the polarizing beam splitter 82 and then, by way of the ¼ wavelength plate 85, re-enters the rectangular prism 86. The second beam incident on the rectangular prism 86 is reflected by its two reflective surfaces and then, by way of the ¼-wavelength plate 85, re-enters the polarizing beam splitter 82.

The second beam input from the rectangular prism 86 is reflected by the polarizing beam splitter 82. The first beam input from the movable rear reflection mirror 73 passes through the polarizing beam splitter 82. Namely, the first and second beams incident on the polarizing beam splitter 82 are recombined together and then enter a detector 87. At the detector 87, interference fringes formed by the two beams can be observed and counted so as to determine the amount of movement of the reflecting intersection of the movable rear reflection mirror 73, i.e., reflecting intersection of the scanning movable reflection mirror 72, in the y-direction. In this manner, the depicted interference optical system constitutes a double-path interferometer.

Figure 6:
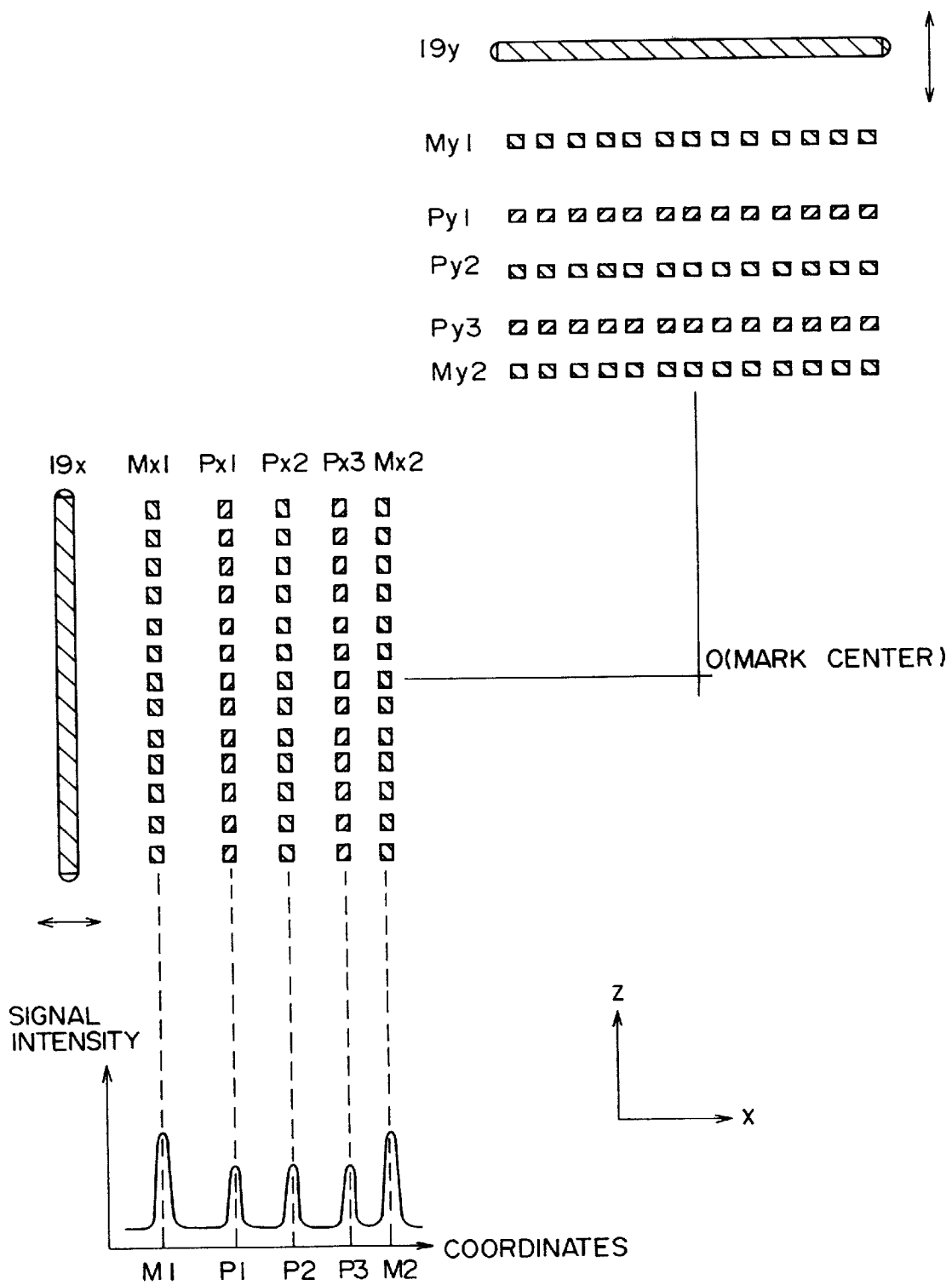
FIG. 6 is a drawing showing the relationship between the mask mark and plate mark and the intensity distribution of the diffracted light obtained by optical scanning.

FIG. 6 is a drawing showing the relationship between the mask mark and plate mark and the intensity distribution of the diffracted light obtained by optical scanning.

As mentioned above, since each projection optical system substantially has no chromatic aberration, the diffracted light component from a mark extending in the direction orthogonal to the light-exposure scanning direction reaches the spatial filter 16$x$ while the diffracted light component from a mark extending in the light-exposure scanning direction reaches the spatial filter 16$y$, whereby they are photoelectrically detected.

As depicted, two grating-like marks Mx1 and Mx2, whose longitudinal directions extend in the z-direction, have been formed on the mask. These marks Mx1 and Mx2 are scanned in the x-direction with the linear beam 19$x$ whose longitudinal direction similarly extends in the z-direction. On the other hand, three grating-like marks Px1 to Px3, whose longitudinal directions extend in the z-direction, have been formed on the plate. These marks Px1 to Px3 are scanned in the x-direction with the linear beam 19'$x$ (not depicted) whose longitudinal direction similarly extends in the z-direction.

Also, two grating-like marks My1 and My2, whose longitudinal directions extend in the x-direction, have been formed on the mask. These marks My1 and My2 are scanned in the z-direction with the linear beam 19$y$ whose longitudinal direction similarly extends in the x-direction. On the other hand, three grating-like marks Py1 to Py3, whose longitudinal directions extend in the x-direction, have been formed on the plate. These marks Py1 to Py3 are scanned in the z-direction with the linear beam 19'$y$ (not depicted) whose longitudinal direction similarly extends in the x-direction.

FIG. 6 shows a signal intensity distribution obtained when the grating-like marks Mx1 and Mx2 on the mask and the grating-like marks Px1 to Px3 on the plate are scanned with the linear beams 19x and 19'x, respectively.

As depicted, the strongest signals are successively obtained at points of M1, P1, P2, P3, and M2 at times when the centers of the linear beams 19x and 19'x coincide with the centers of the grating-like marks Mx1, Px1, Px2, Px3, and Mx2 in the x-direction.

As mentioned above, the coordinates of the center of the linear beam are obtained on the basis of the amount of movement Δ of the reflecting intersection of the rectangular prism 3. Accordingly, two-dimensional positional deviation between the mask and the plate can be measured when the difference between the coordinates of the center of the positions of the strongest signals M1 and M2 obtained from the two grating-like marks on the mask, i.e., (M1+M2)/2, and the coordinates of the center of the positions of the strongest signals P1 to P3 obtained from the three grating-like marks on the plate, i.e., (P1+P2+P3)/3 or {(P1+P3)/4+P2/2}, is determined with respect to each direction.

In this embodiment, as a mark on the plate in each direction, a so-called multimark comprising three grating-like marks is used. Since the three grating-like marks are formed with a space of a predetermined distance therebetween, even when the signal intensity obtained from the mask mark is nearly the same as that obtained from the plate mark, it can be correctly identified which mark the signal comes from.

When the signal obtained from the mask mark is easily discernible from that obtained from the plate mark based on their intensity, it is necessary to use a multimark as the plate mark. Also, when it is unnecessary to determine the center of each mark by an averaging processing, the multimark may not be used.

A plurality of sets of such mask marks are formed on the broken lines 32A and 32B in FIG. 1, whereas a plurality of sets of such plate marks are formed on the broken lines 34A and 34B in FIG. 1. Accordingly, the amount of two-dimensional positional deviation between the mask and the plate is measured at a plurality of places in the x-direction while the mask 31 and the plate 33 are unitedly moved. Thus, the mask 31 and the plate 33 are two-dimensionally scanned at the same time, thereby enabling rapid and highly accurate alignment.

When a magnification-correcting function is added to the projection optical system, there occurs a slight chromatic aberration between the alignment wavelength and the exposure light wavelength. Accordingly, it is desirable that the reference mark on the mask side be aligned with that on the plate side by an image observation operation using the exposure light wavelength so as to measure the offset of the alignment optical system beforehand.

Figure 7:
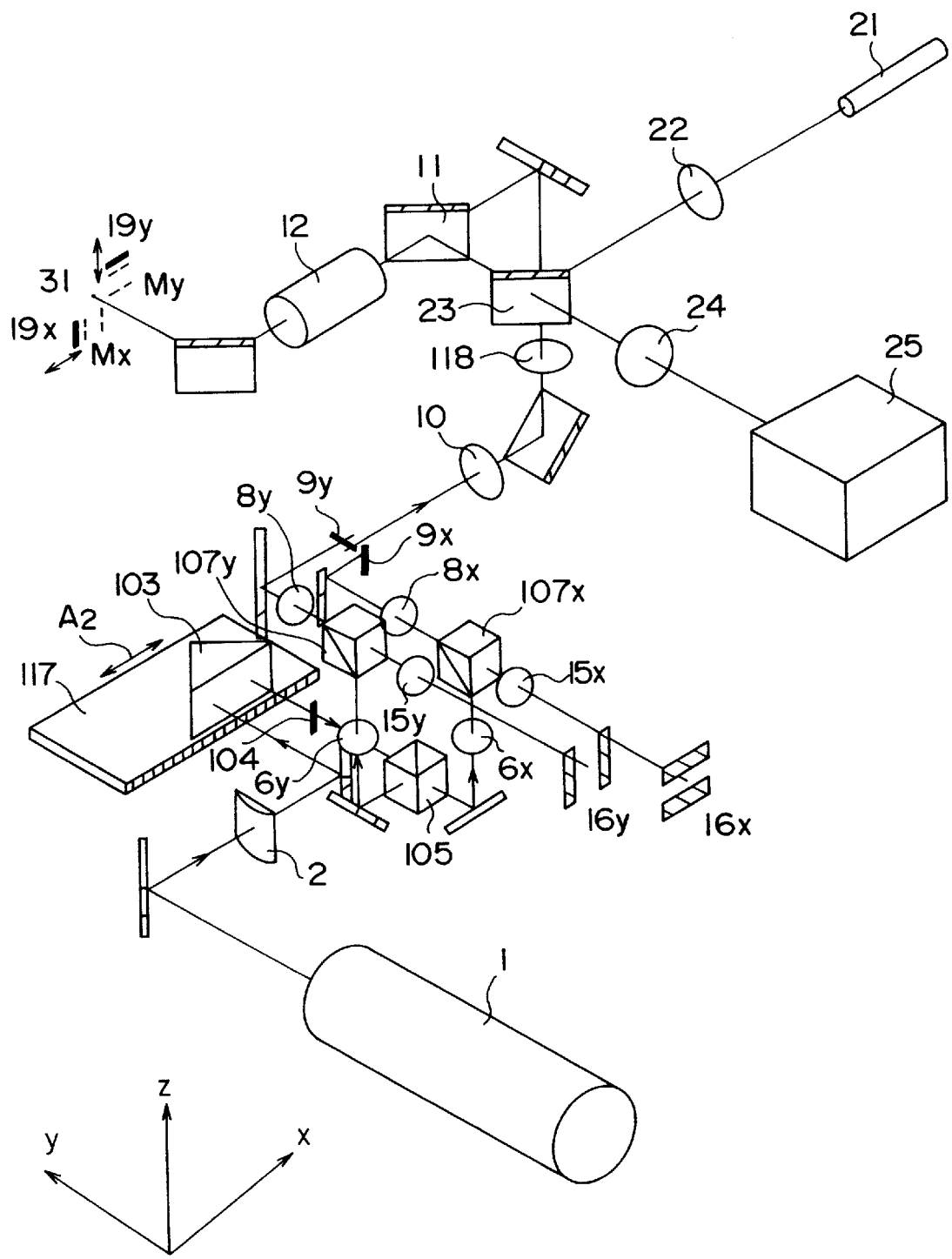
FIG. 7 is a perspective view showing the constitution of a modified example of the alignment optical system.

FIG. 7 is a perspective view showing the constitution of a modified example of the alignment optical system.

The alignment optical system shown in FIG. 7 has a constitution similar to that of the alignment optical system shown in FIG. 2. In particular, their observation optical systems are identical to each other. Accordingly, the elements in FIG. 7 having basically the same functions as those of the constitutional elements in FIG. 2 are referred to with the same marks.

In the following, the scanning optical system in the alignment optical system shown in FIG. 7 will be explained taking into account its basic differences from the constitution of FIG. 2.

In the alignment optical system of FIG. 7, alignment light emitted from a laser 1 becomes, by way of a cylindrical lens 2, a linear beam extending in the z-direction. The beam passing through the cylindrical lens 2 enters a rectangular prism 103. The beam incident on the rectangular prism 103 is reflected by its two reflective surfaces orthogonal to each other and then is emitted in parallel to the incident beam.

As in FIG. 2, the rectangular prism 103 is fixed on a table 117 which is in parallel to the xy-plane and reciprocatively movable in the x-direction as, indicated by an arrow $A_2$ in the drawing.

Thus, the beam emitted from the rectangular prism 103 forms an image as a linear beam 104 due to the condensing action of the above-mentioned cylindrical lens 2. As mentioned above, the linear beam 104 also is parallelly dislocated in the x-direction in response to the movement of the table 117 in the x-direction.

The light from the linear beam 104 enters a polarizing half prism 105 and then is divided into two beams. Namely, by way of a relay lens 6x, a polarizing half prism 107x, and a relay lens 8x, the first beam passing through the polarizing half prism 105 forms an image as a linear beam 9x whose longitudinal direction extends in the z-direction.

On the other hand, by way of a relay lens 6y, a polarizing half prism 107y, and a relay lens 8y, the second beam reflected by the polarizing half prism 105 forms an image as a linear beam 9y whose longitudinal direction extends in the y-direction.

As depicted, the two linear beams 9x and 9y have longitudinal directions which are orthogonal to and spatially separated from each other. Namely, the centers of the two linear beams 9x and 9y are individually deviated from the optical axis of a second objective lens 10 which will be explained later.

By way of the second objective lens 10, a ¼-wavelength plate 118, a dichroic mirror 11, and an objective lens 12, the light components from the two linear beams 9x and 9y respectively form images on the surface of the mask 31 as linear beams 19x and 19y.

As depicted, the linear beam 19x has a longitudinal direction extending in the z-direction, whereas the linear beam 19y has a longitudinal direction extending in the x-direction. Together with the reciprocative movement of the rectangular prism 103 in the x-direction, the linear beam 19x moves in the x-direction to scan a mask mark Mx, while the linear beam 19y moves in the z-direction to scan a mask mark My.

By way of the projection optical system 41C, on the other hand, the light components from the two linear beams 19x and 19y respectively form images on the surface of the plate 33 as linear beams 19'x and 19'y (not depicted).

Also, on the plate 33, the linear beam 19'x has a longitudinal direction extending in the z-direction, whereas the linear beam 19'y has a longitudinal direction extending in the x-direction. Together with the reciprocative movement of the rectangular prism 103 in the x-direction, the linear beam 19'x moves in the x-direction to scan a plate mark Px (not depicted), while the linear beam 19'y moves in the z-direction to scan a plate mark Py (not depicted).

The first diffracted light component from the mask mark Mx with respect to the linear beam 19x enters the polarizing half prism 107x by way of the objective lens 12, the dichroic mirror 11, the ¼-wavelength plate 118, the objective lens 10, and the relay lens 8x. Also, the second diffracted light component from the mask mark My with respect to the linear beam 19y enters the polarizing half prism 107y by way of the objective lens 12, the dichroic mirror 11, the ¼-wavelength plate 118, the objective lens 10, and the relay lens 8y.

By way of a relay lens 15x, the first diffracted light component passing through the polarizing half prism 107x reaches a spatial filter 16x, which is disposed at a position conjugate with the pupil surface of the objective lens 12, and then is photoelectrically detected. Also, by way of a relay lens 15y, the second diffracted light component passing through the polarizing half prism 107y reaches a spatial filter 16y, which is disposed at a position conjugate with the pupil surface of the objective lens 12, and then is photoelectrically detected.

On the other hand, by way of the projection optical system 41C, the objective lens 12, the dichroic mirror 11, the ¼-wavelength plate 118, the second objective lens 10, and the relay lens 8x, the third diffracted light component from the plate mark Px with respect to the linear beam 19'x enters the polarizing half prism 107x. Also, by way of the projection optical system 41C, the objective lens 12, the dichroic mirror 11, the ¼-wavelength plate 118, the second objective lens 10, and the relay lens 8y, the fourth diffracted light component from the plate mark Py with respect to the linear beam 19'y enters the polarizing half prism 107y.

By way of the relay lens 15x, the third diffracted light component passing through the half prism 107x reaches the spatial filter 16x, which is disposed at a position conjugate with the pupil surface of the objective lens 12 and the pupil surface of the projection optical system 41C, and then is photoelectrically detected. Also, by way of the relay lens 15y, the fourth diffracted light component passing through the polarizing half prism 107y reaches the spatial filter 16y, which is disposed at a position conjugate with the pupil surface of the objective lens 12 and the pupil surface of the projection optical system 41C, and then is photoelectrically detected.

Thus, in this modified example, the polarizing half prisms 105, 107x, and 107y are used in place of the half prisms 5, 7, and 7y in FIG. 2 so as to separate luminous fluxes by polarization, while the ¼-wavelength plate 118 is disposed between the second objective lens 10 and the dichroic mirror 11. Accordingly, since the direction of polarization of the diffracted light differs from that of the incident light by 90°, substantially the whole mark-detecting light passes through the polarizing half prisms 107x and 107y, thereby reducing loss in the amount of light.

In each of the above-mentioned embodiments, as explained in the foregoing, the marks in two orthogonal directions are simultaneously scanned with two linear beams which are orthogonal to each other, only a relatively small area is necessary for scanning each mark while concurrent two-dimensional measurement can be effected with a high accuracy.

Also, a so-called multiple point measurement, in which a plurality of marks in the whole area on the mask and plate are measured, can be effected. Accordingly, by averaging the results of such multiple point measurement, accuracy in alignment can be improved.

Further, since concurrent alignment of the mask mark with the plate mark can be effected during scanning performed by a so-called carriage for unitedly moving the mask and the plate, errors caused by movement of the carriage can be reduced.

Also, since two sets of the grating-like marks and three sets of the grating-like marks (i.e., multimarks) are respectively used as the mask marks and the plate marks in each of the above-mentioned embodiments, the signal from the mask mark is easily discernible from that from the plate mark. Further, since the distance between the grating-like marks is known, the magnification of the alignment optical system can be corrected by utilizing it.

Also, the pitch of grating-like marks in the mask mark may be made different from that in the plate mark, thereby distinguishing, on the spatial filter, the diffracted light from the mask mark from that from the plate mark.

Figure 8:
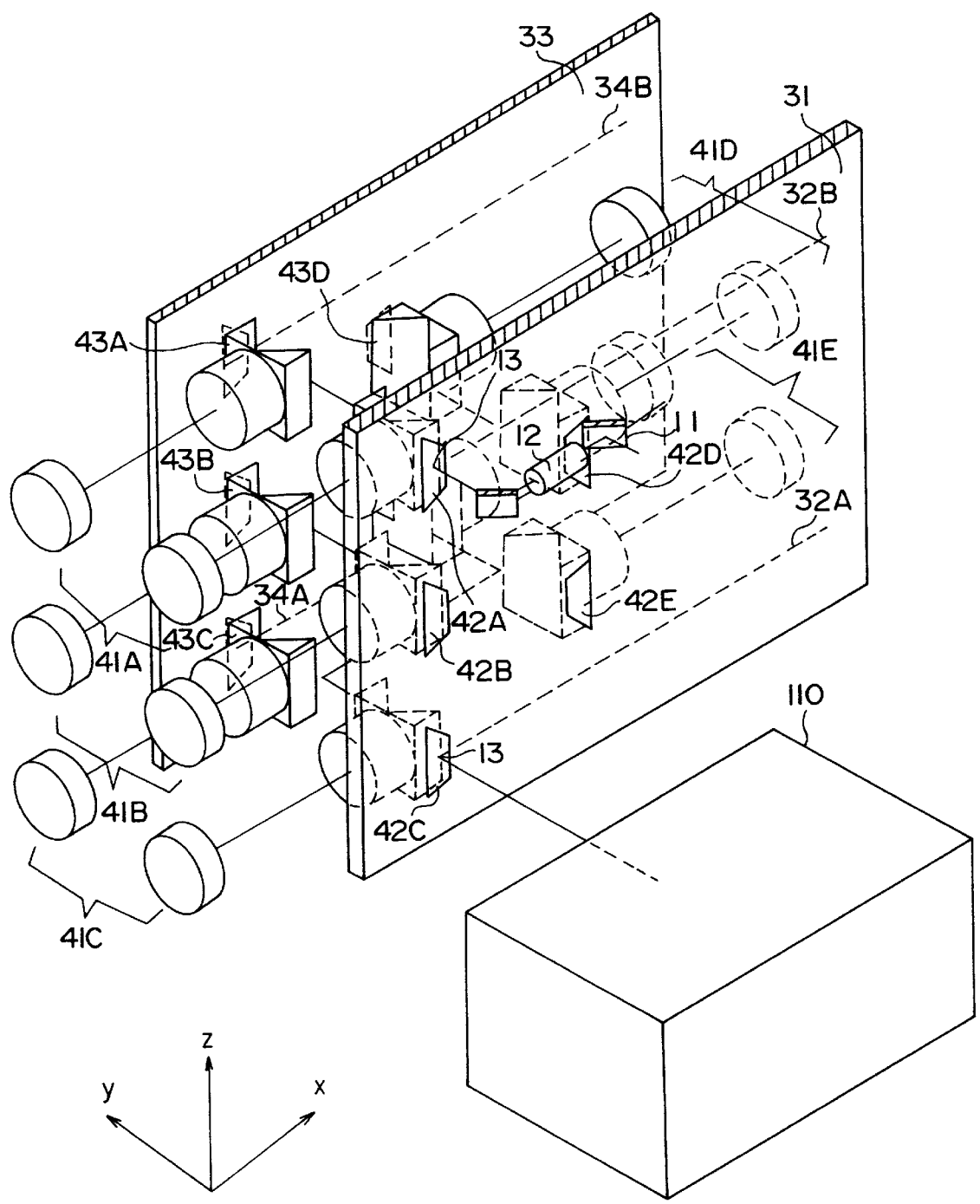
FIG. 8 is a perspective view schematically showing the constitution of an exposure apparatus in which another alignment optical system is used.

FIG. 8 is a perspective view schematically showing the constitution of an exposure apparatus using another alignment optical system. An alignment optical system 110 used in this exposure apparatus is similar to that shown in FIG. 2, though the movable reflection mirror 72 shown in FIG. 5 is used in place of the rectangular prism 3. Also, in the exposure apparatus of FIG. 8, as in the case of FIG. 5, the movable rear reflection mirror 73 is attached to the movable reflection mirror 72 so as to detect the amount of movement of the latter, while an interference optical system is also provided. Thus, in the exposure apparatus of FIG. 8, alignment of the mask 31 with the plate 33 is effected by the alignment optical system 110 using the movable reflection mirror 72.

Figure 9:
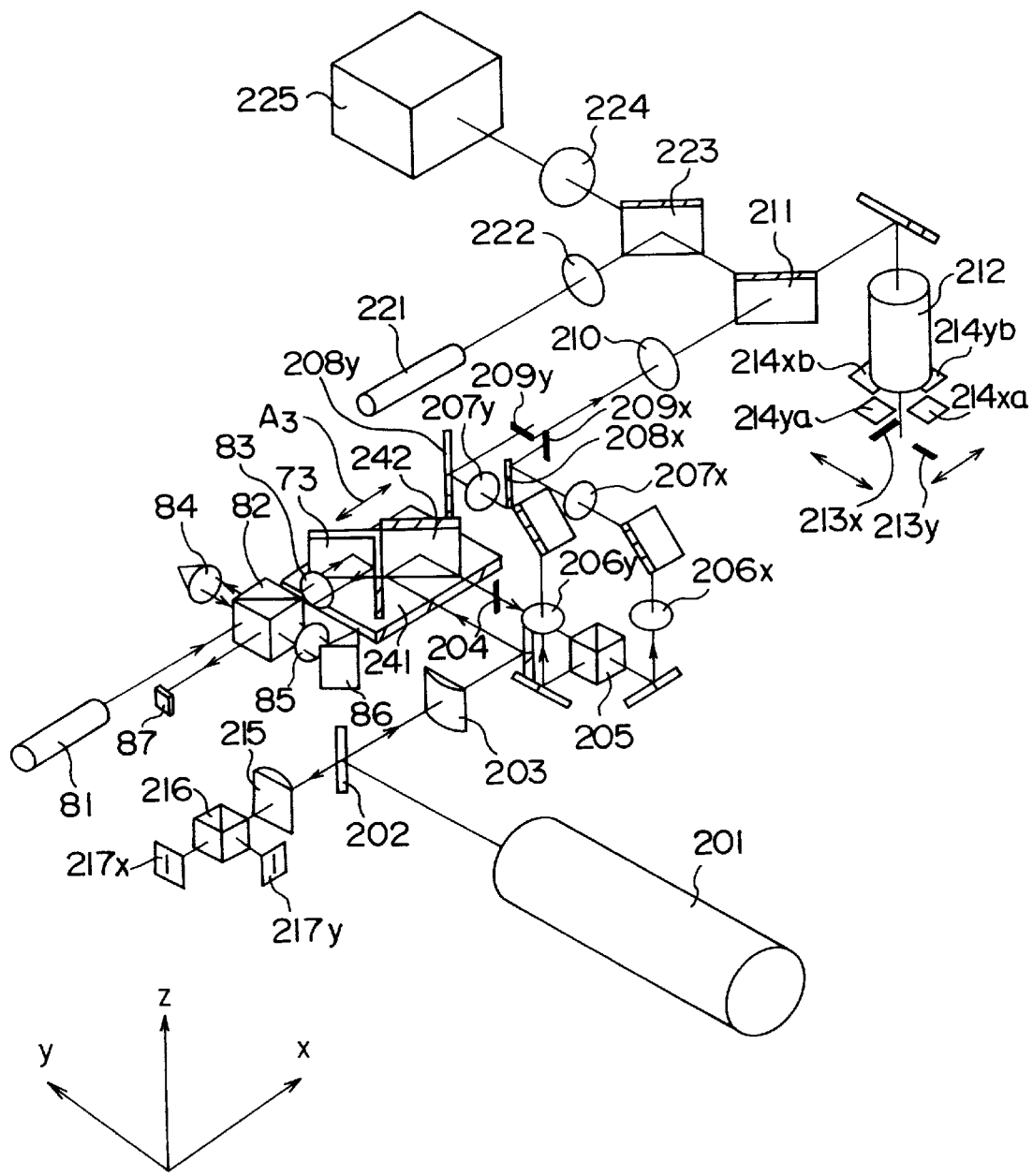
FIG. 9 is a perspective view schematically showing the constitution of a pattern detection apparatus in accordance with an embodiment of the present invention.

FIG. 9 is a perspective view schematically showing the constitution of a pattern detection apparatus in accordance with another embodiment of the present invention.

The apparatus of FIG. 9 has a scanning optical system for scanning a test surface with a linear beam. In the scanning optical system, a beam emitted from a laser 201 in the y-direction is reflected by at half mirror 202 toward the x-direction so as to become, by way of a cylindrical lens 203, a linear beam extending in the z-direction. Preferably, a beam expander is disposed between the laser 210 and the cylindrical lens 203.

The beam passing through the cylindrical lens 203 impinges on a movable reflection mirror 242 having two reflective surfaces which are orthogonal to each other. The movable reflection mirror 242 comprises a first reflective surface, which forms an angle of 45° with respect to the incident beam and is orthogonal to the xy-plane, and a second reflective surface which is orthogonal to the first reflective surface and the xy-plane. The movable reflection mirror 242 is fixed on a table 241 which is in parallel to the xy-plane. The table 241 is reciprocatively movable in the x-direction as shown by an arrow $A_3$ in the drawing.

In this manner, the beam incident on the first reflective surface in the y-direction is reversed by way of the two reflective surfaces and then, due to the condensing action of the cylindrical lens 203, forms an image as a linear beam 204. As mentioned above, the linear beam 204 moves in the x-direction (i.e., is parallelly dislocated) in response to the movement of the table 241 in the x-direction.

The light from the linear beam 204 enters a polarizing beam splitter 205 and then is divided into two beams. Namely, the first beam passing through the polarizing beam splitter 205 impinges on a mirror 208x by way of a focal relay lenses 206x and 207x. On the other hand, the second beam reflected by the polarizing beam splitter 205 in the x-direction impinges on a mirror 208y by way of a focal relay lenses 206y and 207y.

Then, the first beam reflected by the mirror 208x forms an image as a linear beam 209x whose longitudinal direction extends in the z-direction, whereas the second beam reflected by the mirror 208y forms an image as a linear beam 209y whose longitudinal direction extends in the y-direction.

As depicted, the longitudinal directions of the two linear beams 209x and 209y are orthogonal to and spatially separated from each other. Namely, the centers of the two linear beams 209x and 209y are individually deviated from the optical axis of a second objective lens 210 which will be explained later. Both of the directions of polarization of the two linear beams 209x and 209y coincide with the longitudinal direction of the linear beam 209y.

The light components from the two linear beams 209x and 209y respectively form images as linear beams 213x and 213y on the test surface by way of the second objective lens 210, a dichroic mirror 211, and an objective lens 212.

As depicted, the linear beam 213x has a longitudinal direction extending in the x-direction, whereas the linear beam 213y has a longitudinal direction extending in the y-direction. Together with the reciprocative movement of the movable reflection mirror 242 in the x-direction, the linear beam 213x is scanned in the y-direction whereas the linear beam 213y is scanned in the x-direction.

The scattered light component from the test surface with respect to the linear beam 213x is detected by detectors 214xa and 214xb. Also, the scattered light component from the test surface with respect to the linear beam 213y is detected by detectors 214ya and 214yb.

On the other hand, the first regularly reflected light component from the test surface with respect to the linear beam 213x and the second regularly reflected light component from the test surface with respect to the linear beam 213y individually go back the same optical paths to enter the beam splitter 205 where they are combined together.

Thus combined two pattern-detecting light components (i.e., first and second regularly reflected light components) further go back their incoming paths to impinge on the half mirror 202 by way of the movable reflection mirror 242. The combined pattern-detecting light passing through the half mirror 202 enters a polarizing beam splitter 216 by way of a cylindrical lens 215. In the polarizing beam splitter 216), the incident combined pattern-detecting light is divided into the first regularly reflected light component and the second regularly reflected light component again. Namely, the first regularly reflected light component passes through the polarizing beam splitter 216 to enter an opening 217x such as a slit which is fixed at a position conjugate with the test surface. Also, the second regularly reflected light component is reflected by the polarizing beam splitter 216 to enter an opening 217y such as a slit which is fixed at a position conjugate with the test surface.

In this manner, since the pattern-detecting light from the test surface re-enters the movable reflection mirror when going back its incoming path, it apparently stands still even during scanning. Accordingly, without being influenced by scanning, it forms an image at the same position of a cofocal slit fixed at a position conjugate with the test surface. Then, the first regularly reflected light component and the second regularly reflected light component respectively passing through the openings 217x and 217y are photoelectrically detected by light-receiving means not depicted.

In this manner, concurrent two-dimensional scanning in the x-direction and y-direction on the test surface becomes possible, while two pattern-detecting light components respectively corresponding to two scan beams are photoelectrically detected without mingling with each other. As a result, rapid and highly accurate pattern detection can become possible.

Also, the apparatus of FIG. 9 has an observation optical system for observing the test surface. In the observation optical system, light emitted from a light guide 221 such as optical fiber passes through a collector lens 222 and then is reflected by a half mirror 223 so as to impinge on the dichroic mirror 211. The light component reflected by the dichroic mirror 211 illuminates the test surface by way of the objective lens 212.

The light component from the test surface with respect to the illuminating light impinges on a half mirror 223 by way of the objective lens 212 and the dichroic mirror 211. The light component passing through the half mirror 223 reaches an image pickup element 225 by way of an observation second objective lens 224. Thus, an image of the test surface can be observed by the observation optical system.

Further, the apparatus of FIG. 9 has an interference optical system for measuring the amount of movement of the reflecting intersection of the movable reflection mirror 242 in the x-direction.

This interference optical system is similar to the optical system explained with reference to FIG. 5 and constitutes a double-path interferometer.

Figure 10:
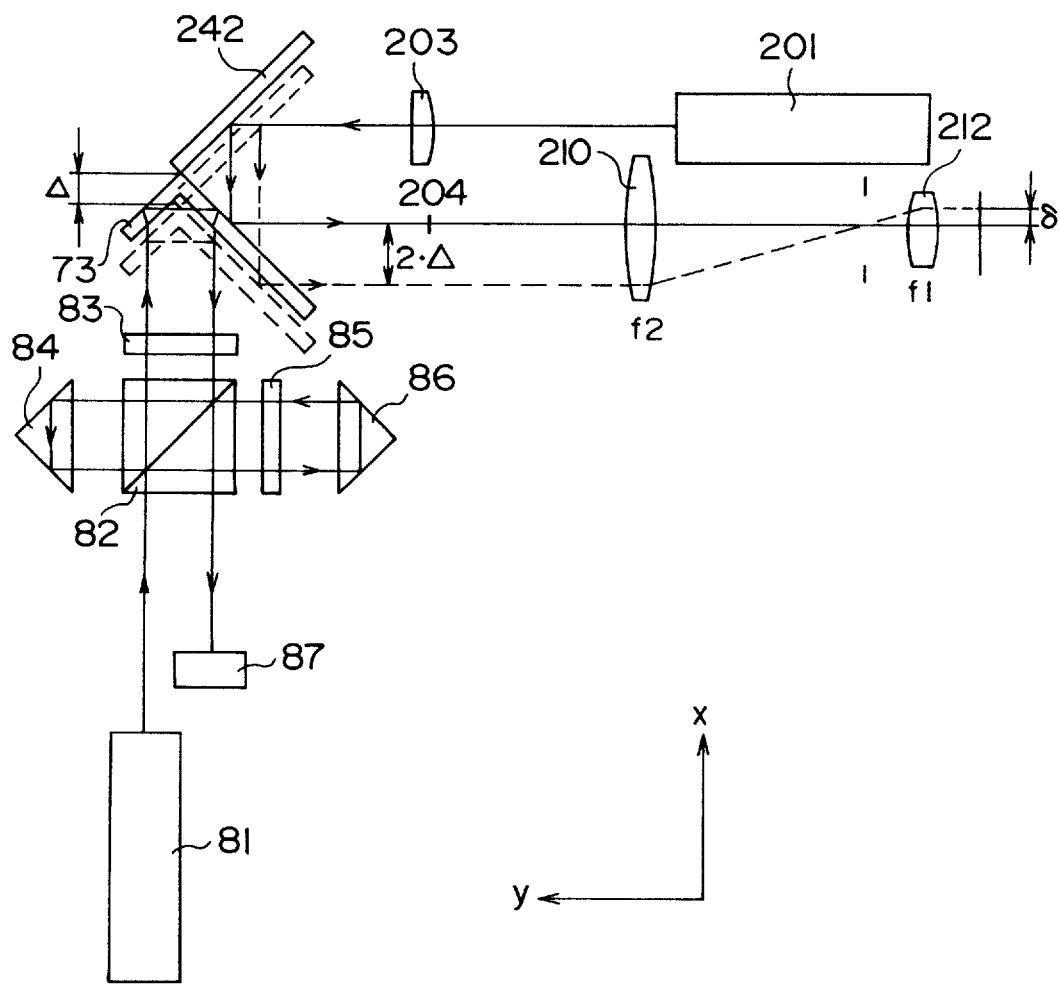
FIG. 10 is a drawing showing the principle of actions of the scanning optical system and interference optical system used in the pattern detection apparatus shown in FIG. 9.

FIG. 10 is a drawing showing the principle of actions of the scanning optical system and interference optical system in FIG. 9.

As depicted, the reflecting intersection of the scanning movable reflection mirror 242 and that of the measuring movable reflection mirror 73 coincide with each other, while the incident beam on the scanning movable reflection mirror 242 and the measuring beam incident on the measuring movable reflection mirror 73 are orthogonal to each other.

The amount of parallel dislocation of the beam caused by the action of the scanning movable reflection mirror 242 constructed above solely depends on the amount of movement $\Delta$ of the reflecting intersection in the x-direction, independent of the rotation of the scanning movable reflection mirror 242 or its amount of movement in the y-direction.

Also, in the double-path interferometer using the movable rear reflection mirror 73, the amount of movement $\Delta$ of the reflecting intersection of the movable rear reflection mirror 73, i.e., reflecting intersection of the scanning reflection mirror 242, in the x-direction can be accurately measured within a range of first-order approximation on the basis of difference in optical path length. Accordingly, when the amount of movement $\Delta$ of the reflecting intersection of the scanning movable reflection mirror 242 in the x-direction is measured by the depicted double-path interferometer, the amount of parallel dislocation $2\Delta$ of the beam caused by the scanning movable reflection mirror 242 can be accurately determined.

Further, assuming that the focal length of the second objective lens 210 is f2 and the focal length of the objective lens 212 is f1, the relationship expressed by the following equation (6) is established between the amount of movement $\delta$ of linear beam on the test surface and the amount of movement $\Delta$ of the reflecting intersection of the movable reflection mirror 242:

$$67 = 2\Delta \cdot f1/f2 \qquad (6)$$

In this manner, when the amount of movement $\Delta$ of the reflecting intersection of the movable reflection mirror 242 is measured by the interference optical system, the amount of movement $\delta$ of scan beam on the test surface can be accurately determined on the basis of thus measured amount of movement $\Delta$. Thus, by taking into account the amount of movement $\Delta$ of the reflecting intersection of the scanning movable reflection mirror 242 alone, the position of the scan beam on the test surface can be accurately determined without being influenced by locus fluctuation of the movable reflection mirror 242, thereby enabling highly accurate beam scanning.

Figure 11:
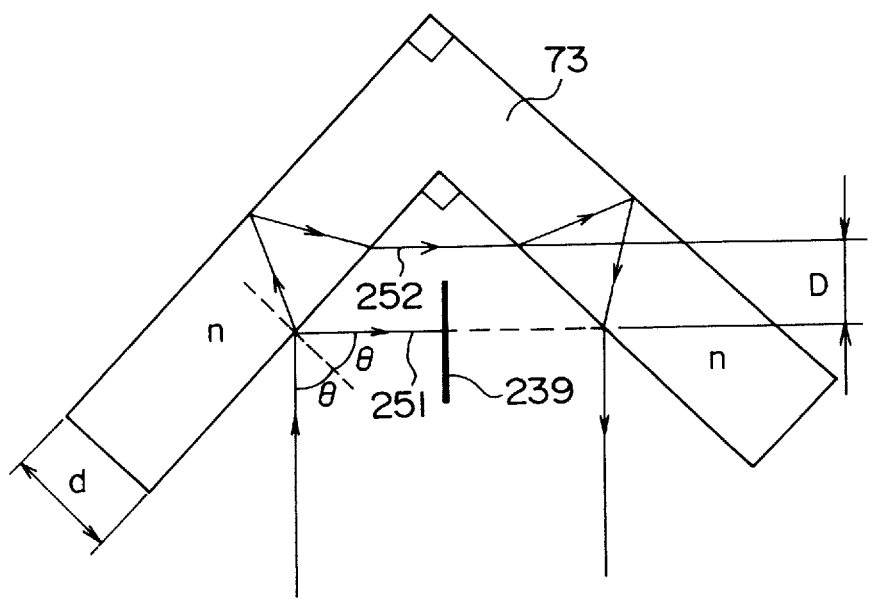
FIG. 11 is a drawing showing a condition under which the surface-reflected light component is cut off in the movable reflection mirror shown in FIG. 10.

FIG. 11 is a drawing explaining a condition under which the surface-reflected light component can be cut off.

In FIG. 11, the light-shielding means for cutting off the surface-reflected light component is, for example, a light-shielding plate 239 disposed between two reflective surfaces of the measuring movable rear reflection mirror 73. It is desirable that this light-shielding plate 239 be constructed so as to cut off only the surface-reflected light component 251 while not cutting off the rear-reflected light component 252.

Assuming that the diameter of the measuring beam is Φ, the thickness of the reflection mirror 73 is d, the refractive index of the reflection mirror 73 is n, and the angle of incident with respect to the surface is θ, the distance D between the surface-reflected light and the rear-reflected light is represented by the following equation (7):

$$D = d \sin 2\theta / \{(n^2 - \sin^2\theta)\}^{1/2} \tag{7}$$

Since θ=45° here, equation (7) can be expressed as the following equation (8):

$$D = d / \{(n^2 - \tfrac{1}{2})\}^{1/2} \tag{8}$$

On the other hand, the condition under which only the surface-reflected light component can be cut off is nothing other than the situation where the surface-reflected light component 251 and the rear-reflected light component 252 are separated from each other without overlapping, it is provided by the following equation (9):

$$D > \Phi \tag{9}$$

When equation (8) is input into equation (9) and it is assumed that refractive index n=1.5, for example, the condition under which only the surface-reflected light component can be cut off is defined by the following conditional expression (10):

$$d > \Phi\{(n^2 - 1/2)\}^{1/2} \approx 1.3\Phi \tag{10}$$

Figure 12:
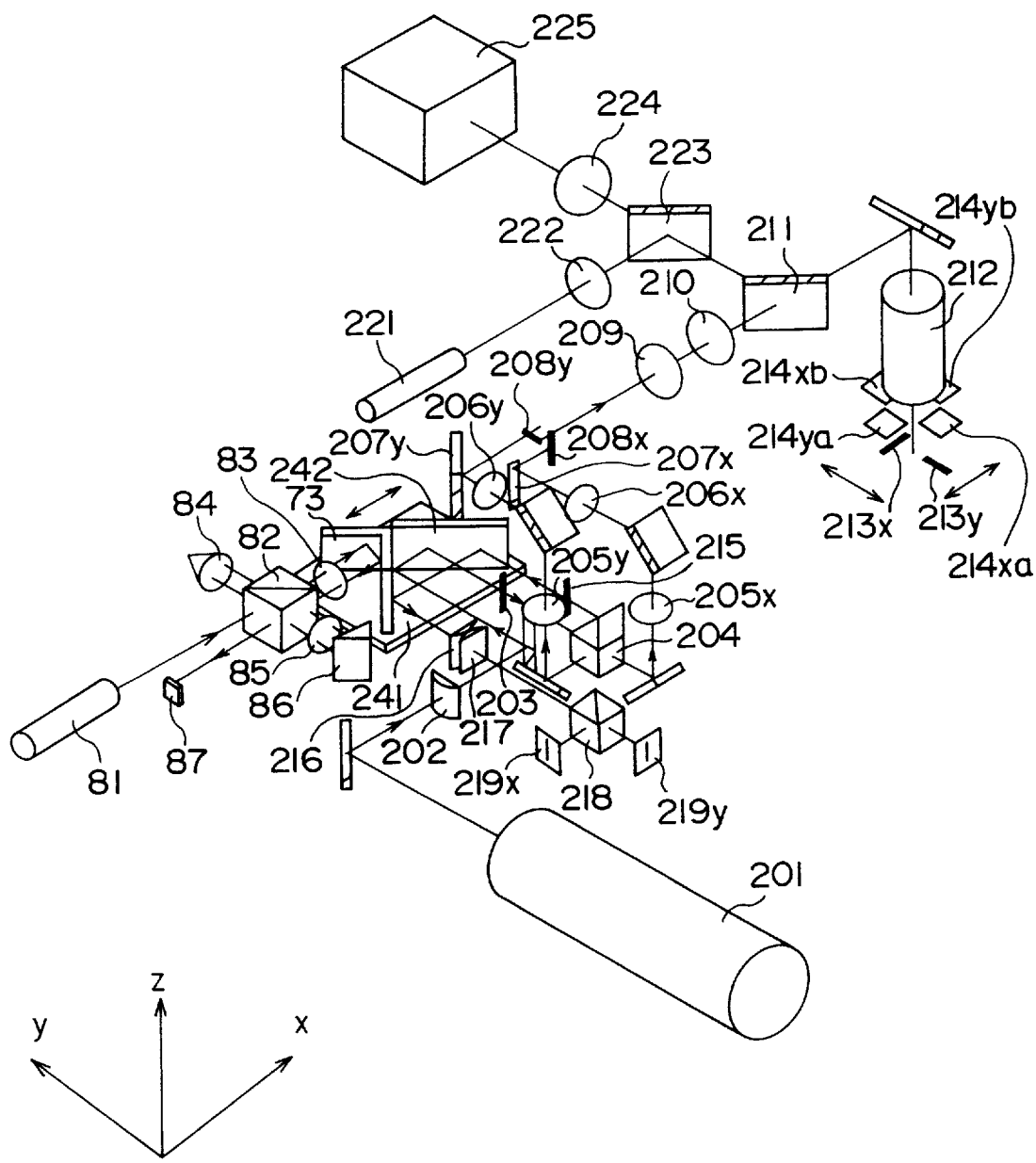
FIG. 12 is a perspective view schematically showing the constitution of a pattern detection apparatus in accordance with an embodiment of the present invention.

FIG. 12 is a perspective view schematically showing the constitution of a pattern detection apparatus in accordance with another embodiment of the present invention.

In the pattern detection apparatus shown in FIG. 12, the interference optical system and observation optical system have totally the same constitutions as those of FIG. 9, while its scanning optical system is similar to that in FIG. 9. Accordingly, the elements in FIG. 12 having basically the same functions as those of the constitutional elements in FIG. 7 are referred to with the same marks.

In the following, the scanning optical system in the pattern detection apparatus shown in FIG. 12 will be explained taking into account its basic differences from the constitution of FIG. 12.

In the scanning optical system in FIG. 12, a beam emitted from a laser 201 becomes, by way of a cylindrical lens 202, a linear beam. The beam passing through the cylindrical lens 202 impinges on a movable reflection mirror 242 having two reflective surfaces, i.e., first and second reflective surfaces, which are orthogonal to each other.

As in the case of the embodiment shown in FIG. 9, the movable reflection mirror 242 is fixed on a table 241, while the table 241 and, accordingly, the movable reflection mirror 242 are reciprocatively movable in the x-direction depicted by an arrow in the drawing.

In this manner, the beam reflected from the movable reflection mirror 242 forms an image as a linear beam 203 due to the condensing action of the above-mentioned cylindrical lens 202. Also, the light from the linear beam 203 is divided into two beams by a polarizing beam splitter 204.

The first beam passing through the polarizing beam splitter 204 impinges on a mirror 207x by way of relay lenses 205x and 206x. On the other hand, the second beam reflected by the polarizing beam splitter 204 impinges on a mirror 207y by way of relay lenses 205y and 206y.

The first beam reflected by the mirror 207x forms an image as a linear beam 208x whose longitudinal direction extends in the z-direction. Also, the second beam reflected by the mirror 207y forms an image as a linear beam 208y whose longitudinal direction extends in the y-direction.

As depicted, the longitudinal directions of the two linear beams 208x and 208y are orthogonal to and spatially separated from each other. Namely, the centers of the two linear beams 208x and 208y are individually deviated from the optical axis of a second objective lens 209 which will be explained later. Both of the directions of polarization of the two linear beams 208x and 208y coincide with the longitudinal direction of the linear beam 208y.

The light components from the two linear beams 209x and 209y respectively form images as linear beams 213x and 213y on a test surface by way of the second objective lens 209, a ¼-wavelength plate 210, a dichroic mirror 211, and an objective lens 212.

As depicted, the linear beam 213x has a longitudinal direction extending in the x-direction, whereas the linear beam 213y has a longitudinal direction extending in the y-direction. Together with the reciprocative movement of the movable reflection mirror 242, the linear beam 213x is scanned in the y-direction whereas the linear beam 213y is scanned in the x-direction.

The scattered light component from the test surface with respect to the linear beam 213x is detected by detectors 214xa and 214xb. Also, the scattered light component from the test surface with respect to the linear beam 213y is detected by detectors 214ya and 214yb.

The first regularly reflected light component from the test surface with respect to the linear beam 213x and the second regularly reflected light component from the test surface with respect to the linear beam 213y individually go back the same optical paths to enter the beam splitter 204 where they are combined together.

Thus combined two pattern-detecting light components (i.e., first and second regularly reflected light components) are reflected by the polarizing beam splitter 204 and, due to the ¼-wavelength plate 210, go through a path different from their incoming paths so as to become a linear beam 215. Since the light from the linear beam 215 goes through the movable reflection mirror 242 again, it apparently stands still even during scanning. Then, the combined pattern-detecting light passing through cylindrical lenses 216 and 217 enters a polarizing beam splitter 218. In the polarizing beam splitter 218, the incident combined pattern-detecting light is divided into the first regularly reflected light component and the second regularly reflected light component again. Namely, the first regularly reflected light component is reflected by the beam splitter 218 to enter an opening 219x such as a slit which is fixed at a position conjugate with the test surface. Also, the second regularly reflected light component passes through the polarizing beam splitter 218 to enter an opening 219y such as a slit which is fixed at a position conjugate with the test surface.

In this manner, since the pattern-detecting light from the test surface re-enters the movable reflection mirror 242 when going back its incoming path, it apparently stands still even during scanning. Accordingly, without being influenced by scanning, it forms an image at the same position of a cofocal slit fixed at a position conjugate with the test surface. Then, the first regularly reflected light component and the second regularly reflected light component respectively passing through the openings 219x and 219y are photoelectrically detected by light-receiving means not depicted.

Thus, in the embodiment shown in FIG. 12, the luminous fluxes impinge on the test surface as circularly polarized light by way of the ¼-wavelength plate 210. Accordingly, it is advantageous in that it is hardly influenced by polarization by the test surface and in that there is substantially no loss in the amount of light.

In the pattern-detecting apparatus in accordance with the embodiment shown in FIG. 12, the two cylindrical lenses 216 and 217 have actions for making the linear beam 215 form images at the cofocal slits 219x and 219y. Accordingly, in place of the cylindrical lenses 216 and 217, a normal lens having a spherical surface may be used.

In the embodiments shown in FIGS. 9 and 12, a reflection mirror having two reflective surfaces, which are orthogonal to each other, is used as a movable reflection means for the scanning optical system and interference optical system. However, as the movable reflection means, a cube corner mirror having three reflective surfaces, which are orthogonal to each other, may be used. In this case, two sets of cube corner mirrors are preferably disposed such that their apexes overlap with each other. Alternatively, a reflective prism such as a rectangular prism having two reflective surfaces, which are orthogonal to each other, may be used.

In the following, assuming that an interferometer has two reflective surfaces shown in FIG. 4, the optical path length difference between the optical paths before and after movement will be studied.

In FIG. 4, the optical path length difference $\Delta\Phi$ between the optical path AB of a reference beam before movement and the optical path AA'B'F of the beam after movement is expressed by the following equation (11):

$$\begin{aligned}\Delta\Phi &= AA' + A'B' + B'D + DF - AB \\ &= 2AA' + A'B' + B'D - 2a\end{aligned} \quad (11)$$

wherein AA'=DF and AB=2a.

From equations (3) and (4), a relationship expressed by the following equation (12) is established:

$$A'B'=2(a-\Delta y)/(\cos^2\alpha-\sin^2\alpha) \quad (12)$$

Also, since B'D=A'B' sin 2α, a relationship expressed by the following equation is established:

$$A'B' + B'D = A'B'(1 + \sin 2\alpha) = A'B'(\cos\alpha + \sin\alpha)^2 \quad (13)$$

When equation (12) is input into equation (13), the following equation (14) is obtained:

$$A'B'+B'D=2(a-\Delta y)(\cos\alpha+\sin\alpha)/(\cos\alpha-\sin\alpha) \quad (14)$$

On the other hand, AA' is expressed by the following equation (15):

$$AA'=a+\Delta x-A'O' \cos(45°-\alpha) \quad (15)$$

Accordingly, when equation (4) is input into equation (15), the following equation (16) is obtained:

$$AA'=a+\Delta x-(a-\Delta y)\times(\cos\alpha+\sin\alpha)/(\cos\alpha-\sin\alpha) \quad (16)$$

Thus, when equations (14) and (16) are input into equation (11), the optical path length difference $\Delta\Phi$ is expressed by the following equation (17):

$$\Delta\Phi=2\Delta x \quad (17)$$

In view of equation (17), it is understood that the optical path length difference $\Delta\Phi$ is determined solely by the amount of movement $\Delta x$ in the direction parallel to the measuring beam, independent of the rotation angle α of the measuring movable reflection mirror or the amount of movement $\Delta y$ in the direction perpendicular to the measuring beam. Namely, assuming that the incident beam in FIG. 4 is the measuring incident beam, the amount of movement $\Delta x$ of the reflecting intersection O in the x-direction can be measured accurately.

As explained in the foregoing, when constitution is such that the reflecting intersection of the scanning movable reflection mirror coincides with that of the measuring movable reflection mirror while the incident beam on the scanning movable reflection mirror is orthogonal to the measuring incident beam on the measuring movable reflection mirror, the amount of movement of the reflecting intersection of the scanning movable reflection mirror in a predetermined direction can be accurately measured by an interferometer, thereby correctly determining the amount of parallel dislocation of beam caused by the scanning movable reflection mirror.

Figure 13:
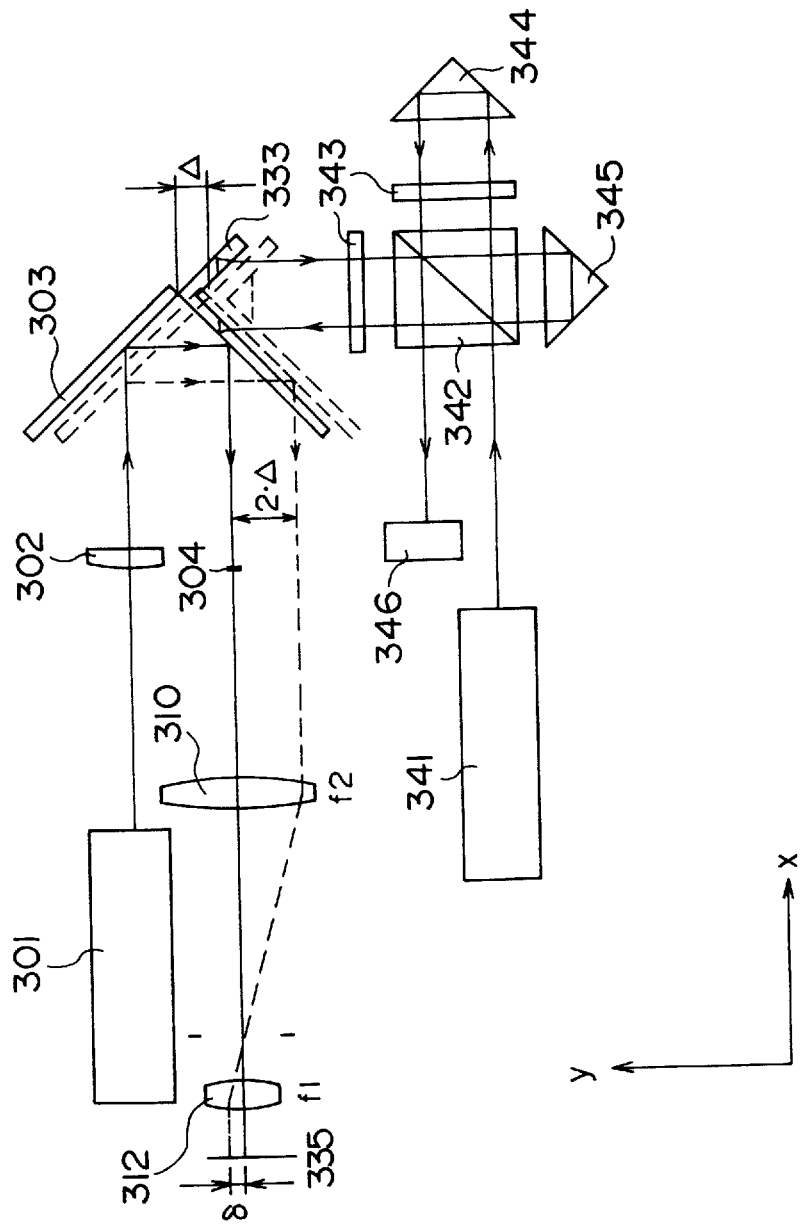
FIG. 13 is a drawing showing the principle of actions of the scanning optical system and interference optical system used in an embodiment of the present invention.

FIG. 13 is a drawing schematically showing the principle of actions of the scanning optical apparatus in accordance with the present invention.

In FIG. 13, as a measuring movable reflection mirror, a rear reflection mirror is used such that the reflecting intersection of the scanning movable reflection mirror coincides with that of the measuring movable reflection mirror. In this manner, a constitution which can be actually designed uses a rear reflection mirror in one of the movable reflection mirrors in the measuring movable reflection mirror and the scanning movable reflection mirror.

Figure 14:
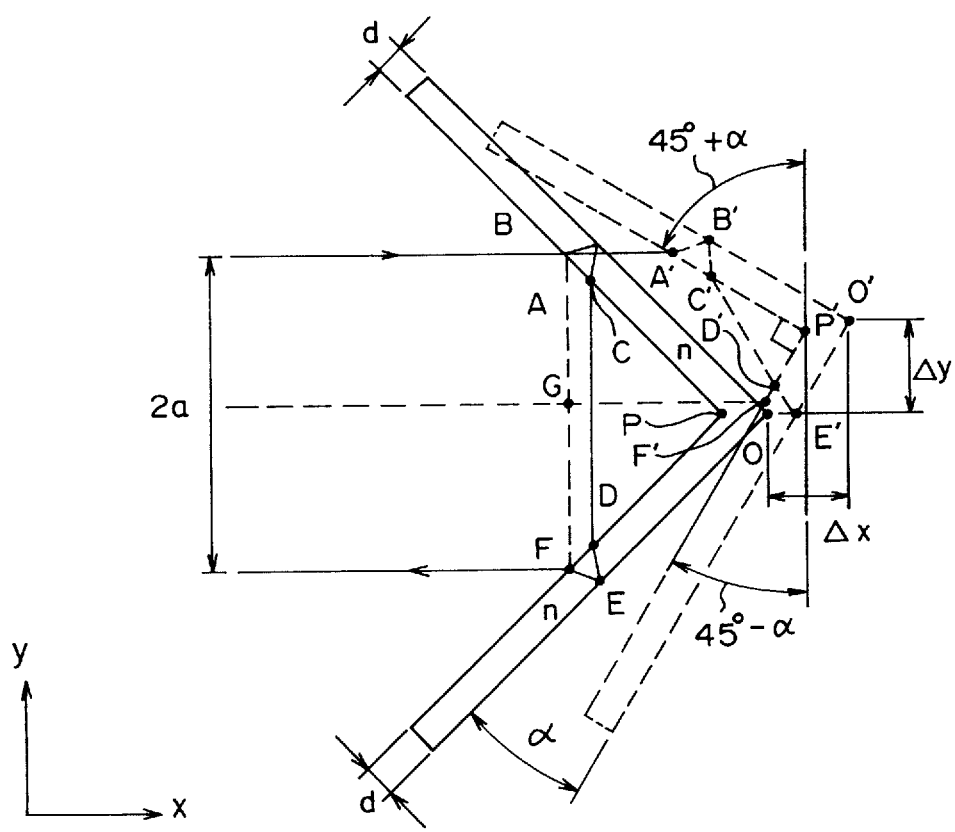
FIG. 14 is a drawing explaining the action of the measurement movable reflection mirror shown in FIG. 13.

FIG. 14 is a drawing explaining the action of the measuring movable reflection mirror using the rear reflection mirror shown in FIG. 13.

As shown in FIG. 14, assuming that the thickness of the movable reflection mirror is d, the refractive index of the movable reflection mirror is n, the amount of movement of the reflecting intersection O in the x-direction is $\Delta x$, the amount of movement of the reflecting intersection O in the y-direction is $\Delta y$, the rotation angle of the movable reflection mirror is α, and the distance AF between the incident measuring beam and the emitted measuring beam in the y-direction is $2a$, the optical path length difference $\delta\Phi$ between the optical paths before and after movement is expressed by the following equation (18):

$$\delta\Phi=AA'+2A'B'+C'D'+2D'E'+F'G-(2AB+CD+2DE) \quad (18)$$

Here, AB, A'B', and D'E' are respectively expressed by the following equations (19) to (21):

$$AB=DE=n\cdot d/\cos\beta \quad (19)$$

wherein:

angle $ABC=2\beta$ $\sin\beta=1/(2^{1/2}n)$ $$A'B'=n\cdot d/\cos\beta' \quad (20)$$

wherein:

angle $A'B'C'=2\beta'$ $\sin\beta'=1/\{n\cdot\sin(\pi/4+\alpha)\}$ $$D'E'=n\cdot d/\cos\beta'' \quad (21)$$

wherein:

angle $D'E'F=2\beta''$ $\sin\beta''=1/\{n\cdot\sin(\pi/4-\alpha)\}$

In view of equations (19) to (21), a relationship expressed by the following equation (22) is established:

$$2(A'B' + D'E') - 2(AB + DE) = 2nd(1/\cos\beta' + 1/\cos\beta'' - 2/\cos\beta) \approx 0 \quad (22)$$

wherein:

$$\alpha \ll 1$$

Assuming that $OP=O'P'=2^{1/2}d=D$ and O is an origin, coordinates of the reflecting intersection O' and point P' (i.e., point corresponding to the reflecting intersection in the case of the surface reflection mirror) after movement are represented by $(\Delta x, \Delta y)$ and $(\Delta x - D \cos \alpha, \Delta y - D \sin \alpha)$, respectively. Accordingly, A'P' is expressed by the following equation (23):

$$\begin{aligned} A'P' &= (a - \Delta y + D\sin\alpha)/\cos(\pi/4 + \alpha) \quad (23) \\ &= 2^{1/2}(a - \Delta y + D\sin\alpha)/(\cos\alpha - \sin\alpha) \end{aligned}$$

Also, C'D', AA', F'G, and P'F' are respectively expressed by the following equations (24) to (26):

$$\begin{aligned} C'D' &= C'P'/\cos(\pi/4 - \alpha) \quad (24) \\ &= (A'P' - 2d\tan\beta')/\cos(\pi/4 - \alpha) \\ &= 2(a - \Delta y + D\sin\alpha)/\cos 2\alpha - \\ & \quad 2 \cdot 2^{1/2}d\tan\beta'/(\cos\alpha + \sin\alpha) \end{aligned}$$

$$\begin{aligned} AA' &= a + D + (\Delta x - D\cos\alpha) - A'P' + \sin(\pi/4 + \alpha) \quad (25) \\ &= a + (1 - \cos\alpha)D + \Delta x - (a - \Delta y + D\sin\alpha) \times \\ & \quad (\cos\alpha + \sin\alpha)/(\cos\alpha - \sin\alpha) \end{aligned}$$

$$\begin{aligned} F'G &= a + (1 - \cos\alpha)D + \Delta x - \quad (26) \\ & \quad P'F'\sin(\pi/4 - \alpha) \end{aligned}$$

Here, P'F' is expressed by the following equation (27):

$$\begin{aligned} P'F' &= P'D' + 2d\tan\beta'' \quad (27) \\ &= C'P'\tan(\pi/4 - \alpha) + 2d\tan\beta'' \\ &= (A'P' - 2d\tan\beta')\tan(\pi/4 - \alpha) + 2d\tan\beta'' \\ &= 2^{1/2}(a - \Delta y + D\sin\alpha)/(\cos\alpha + \sin\alpha) + 2d[\tan\beta'' - \\ & \quad \{(\cos\alpha - \sin\alpha)/(\cos\alpha + \sin\alpha)\}\tan\beta'] \end{aligned}$$

Accordingly, in view of equations (26) and (27), F'G is expressed by the following equation (28):

$$\begin{aligned} F'G &= a + (1 - \cos\alpha)D + \Delta x - (a - \Delta y + D\sin\alpha) \times \quad (28) \\ & \quad (\cos\alpha - \sin\alpha)/(\cos\alpha + \sin\alpha) - 2^{1/2}d(\cos\alpha - \sin\alpha)[\tan\beta'' - \\ & \quad \{(\cos\alpha - \sin\alpha)/(\cos\alpha + \sin\alpha)\}\tan\beta'] \end{aligned}$$

Also, in view of equations (24), (25), and (28), a relationship expressed by the following equation (29) is established:

$$\begin{aligned} AA' + C'D' + F'G &= 2a + 2\Delta x + \{2(1 - \cos\alpha) - \quad (29) \\ & \quad (\cos\alpha + \sin\alpha)\tan\beta' - (\cos\alpha - \sin\alpha)\tan\beta''\}D \approx 2a + \\ & \quad 2\Delta x - 2D\tan\beta = 2a + 2\Delta x - 2 \cdot 2^{1/2}d\tan\beta \end{aligned}$$

Here, since $CD=2a-2\cdot 2^{1/2}d \tan \beta$, using the results of equations (22) and (29), the optical path length difference $\delta\Phi$ is expressed by the following equation (30):

$$\delta\Phi = AA' + C'D' + F'G - CD + 2(A'B' + D'E' - AB - DE) \approx 2\Delta x \quad (30)$$

In this manner, also in the interferometer of FIG. 13 using a rear reflection mirror, the amount of movement $\Delta x$ of the reflecting intersection O can be accurately measured within a range of first approximation on the basis of the optical path length difference $\delta\Phi$ in view of equation (30).

The amount of movement $\Delta x$ in FIG. 14 is nothing other than the amount of movement $\Delta$ of the reflecting intersection of a scanning movable reflection mirror 303 in FIG. 13. Accordingly, based on the amount of movement $\Delta$ accurately measured from the optical path length difference in the measuring beam with respect to the measuring movable reflection mirror 333, the amount of parallel dislocation $2\Delta$ due to the action of the scanning movable reflection mirror 303 and, accordingly, the amount of movement $\delta$ of the scan beam on the test surface can be correctly obtained.

In the following, another embodiment of the present invention will be explained with reference to attached drawings.

Figure 15:
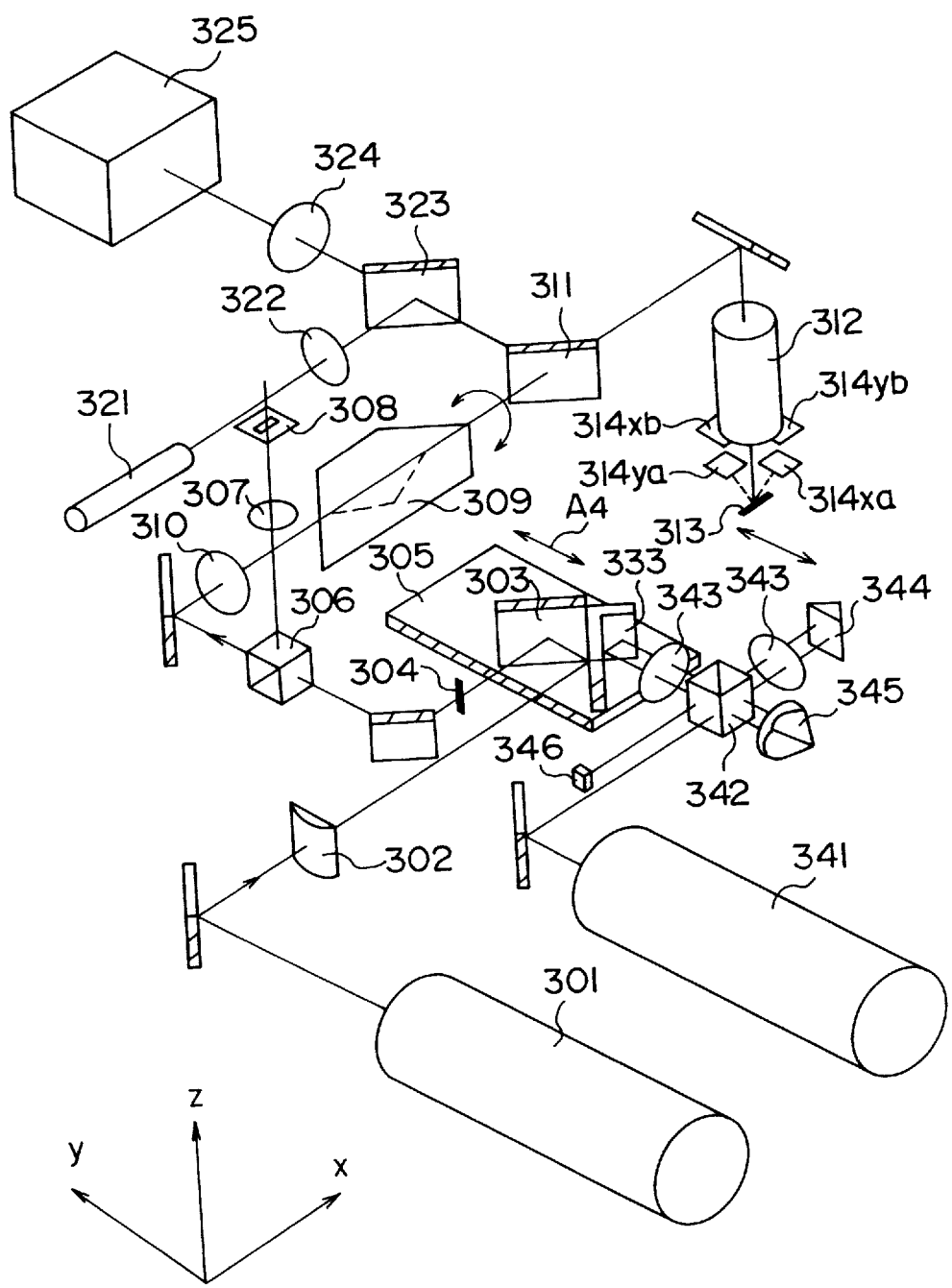
FIG. 15 is a perspective view schematically showing the constitution of a scanning optical apparatus in accordance with an embodiment of the present invention.

FIG. 15 is a perspective view schematically showing the constitution of the scanning optical apparatus in accordance with this embodiment.

The apparatus of FIG. 15 has a scanning optical system for scanning a test surface with a linear beam. In the scanning optical system, a beam emitted from a laser 301 in the y-direction is reflected by a mirror toward the x-direction so as to become, by way of a cylindrical lens 302, a linear beam extending in the z-direction. Preferably, a beam expander is disposed between the laser 301 and the cylindrical lens 302.

The beam passing through the cylindrical lens 302 impinges on a movable reflection mirror 303. The movable reflection mirror 303 comprises a first reflective surface, which forms an angle of 45° with respect to the incident beam and is orthogonal to the xy-plane, and a second reflective surface which is orthogonal to the first reflective surface and the xy-plane. The movable reflection mirror 303 is fixed on a table 305 which is in parallel to the xy-plane. The table 305 is reciprocatively movable in the y-direction as shown by an arrow $A_4$ in the drawing.

In this manner, the beam incident on the first reflective surface is reversed in the x-direction by way of the two reflective surfaces and then, due to the condensing action of the cylindrical lens 302, forms an image as a linear beam 304. As mentioned above, the linear beam 304 moves in the y-direction (i.e., is parallelly dislocated) in response to the movement of the table 305 in the y-direction.

Further, the linear beam 304 is directed to the y-direction by a mirror so as to enter a beam splitter 306. The beam passing through the beam splitter 306 is directed to the x-direction by a mirror so as to enter a second objective lens 310.

The beam refracted by the second objective lens 310 impinges on a mirror by way of an image rotation prism 309 and a dichroic mirror 311. The beam polarized in the z-direction by the mirror forms an image on the test surface as a linear beam 313 by way of an objective lens 312.

As depicted, the linear beam 313 extends in the x-direction and is movable in the y-direction in response to the reciprocative movement of the movable reflection mirror 303.

The second objective lens 310 and the objective lens 312 constitute an afocal system. When the image rotation prism 309 disposed in the optical path between the second objective lens 310 and the objective lens 312 is appropriately rotated around the optical axis, the longitudinal direction of the linear beam 313 formed on the test surface as well as its scanning direction can be changed. Here, the dotted line within the prism 309 indicates the optical path.

The scattered light components from the test surface are detected by detectors 314xa and 314xb. On the other hand, the regularly reflected light component and diffracted light component from the test surface enter the beam splitter 306 by way of the objective lens 312, the dichroic mirror 311, the image rotation prism 309, and the second objective lens 310. The regularly reflected light component reflected in the z-direction by the beam splitter 306 passes through a relay lens 307 and then is photoelectrically detected through an opening 308 such as a slit which is disposed at a position conjugate with the pupil surface of the objective lens 312. Also, when the diffracted light is to be detected, it is photoelectrically detected by way of a spatial filter (not depicted) which is disposed at a position conjugate with the pupil surface of the objective lens 312.

Also, the apparatus of FIG. 15 has an observation optical system for observing the test surface. In the observation optical system, light emitted from a light guide 321 such as optical fiber passes through a collector lens 322 and then is reflected by a, half mirror 323 so as to impinge on the dichroic mirror 311. The light reflected by the dichroic mirror 311 illuminates the test surface by way of the objective lens 312.

The light component from the test surface with respect to the illuminating light impinges on, a half mirror 323 by way of the objective lens 312 and the dichroic mirror 311. The light passing through the half mirror 323 reaches an image pickup element 325 by way of an observation second objective lens 324. Thus, an image of the test surface can be observed by the observation optical system.

Further, the apparatus of FIG. 15 has an interference optical system for measuring the amount of movement of the reflecting intersection of the movable reflection mirror 303 in the y-direction. In this interference optical system, a beam emitted from a laser 341 is divided by a polarizing beam splitter 342 into a first beam directed to a movable rear reflection mirror 333 and a second beam directed to a rectangular prism 344 which is a fixed mirror.

The movable rear reflection mirror 333 comprises a first reflective surface, which forms an angle of 45° with respect to the incident beam and is orthogonal to the xy-plane, and a second reflective surface which is orthogonal to the first reflective surface and the xy-plane. Also, the movable rear reflection mirror 333 is fixed on the table 305, while the reflecting intersection of the movable rear reflection mirror coincides with that of the movable reflection mirror 303.

The first beam directed to the movable rear reflection mirror 333 by way of the polarizing beam splitter 342 impinges on the movable rear reflection mirror 333 by way of a ¼-wavelength plate 343. The first beam incident on the movable rear reflection mirror 333 is reflected by its first and second reflective surfaces and then re-enters the polarizing beam splitter 342 by way of the ¼-wavelength plate 343.

On the other hand, the second beam directed to the rectangular prism 344, which is a fixed reflection mirror, enters the rectangular prism 344 by way of another ¼-wavelength plate 343. The second beam incident on the rectangular prism 344 is reflected by its two reflective surfaces and then re-enters the beam splitter 342.

The first beam input from the movable rear reflection mirror 333 passes through the polarizing beam splitter 342. On the other hand, the second beam input from the rectangular prism 344 is reflected by the polarizing beam splitter 342. Namely, the first and second beams incident on the polarizing beam splitter 342 are combined together and then enter a cube corner 345. The two beams reversed at the cube corner 345 re-enter the polarizing beam splitter 342.

The first beam passes through the polarizing beam splitter 342 and then re-enters the movable rear reflection mirror 333 by way of the ¼-wavelength plate 343. The first beam incident on the movable rear reflection mirror 333 is reflected by its two reflective surfaces and then re-enters the polarizing beam splitter 342 by way of the ¼-wavelength plate 343.

On the other hand, the second beam is reflected by the polarizing beam splitter 342 and then re-enters the rectangular prism 344 by way of the ¼-wavelength plate 343. The second beam incident on the rectangular prism 344 is reflected by its two reflective surfaces and then re-enters the polarizing beam splitter 342 by way of the ¼-wavelength plate 343.

The second beam input from the rectangular prism 344 passes through the polarizing beam splitter 342. On the other hand, the first beam input from the movable rear reflection mirror 333 is reflected by the polarizing beam splitter 342. Namely, the first and second beams incident on the polarizing beam splitter 342 are recombined together and then enter a detector 346. At the detector 346, interference fringes formed by the two beams can be observed and counted so as to determine the amount of movement of the reflecting intersection of the movable rear reflection mirror 333, i.e., reflecting intersection of the scanning movable reflection mirror 303, in the y-direction. In this manner, the depicted interference optical system constitutes a double-path interferometer.

FIG. 13 is a drawing showing the principle of actions of the scanning optical system and interference scanning system in FIG. 15.

As depicted, when the reflecting intersection of the movable reflection mirror 303 moves by $\Delta$ in the y-direction, the linear beam 304 is parallelly dislocated by $2\Delta$ due to the action of the movable reflection mirror 303. Assuming that the focal length of the second objective lens 310 is f2 and the focal length of the objective lens 312 is f1, a relationship expressed by the following equation (31) is established between the amount of movement $\delta$ of the linear beam 313 on a test surface 335 and the amount of movement $\Delta$ of the reflecting intersection of the movable reflection mirror 303:

$$\delta = 2\Delta \cdot f1/f2 \qquad (31)$$

As mentioned above, the amount of movement $\Delta$ of the reflecting intersection of the movable reflection mirror 303 can be accurately measured by the interference optical system.

In this manner, when the amount of movement $\Delta$ of the reflecting intersection of the movable reflection mirror 303 is accurately measured by the interference optical system, the amount of movement $\delta$ of scan beam on the test surface can be correctly determined on the basis of thus measured amount of movement $\Delta$. Thus, by taking into account the amount of movement $\Delta$ of the reflecting intersection of the scanning movable reflection mirror 303 alone, the position of the scan beam on the test surface can be accurately determined without being influenced by locus fluctuation of the movable reflection mirror, thereby enabling highly accurate beam scanning.

Figure 16:
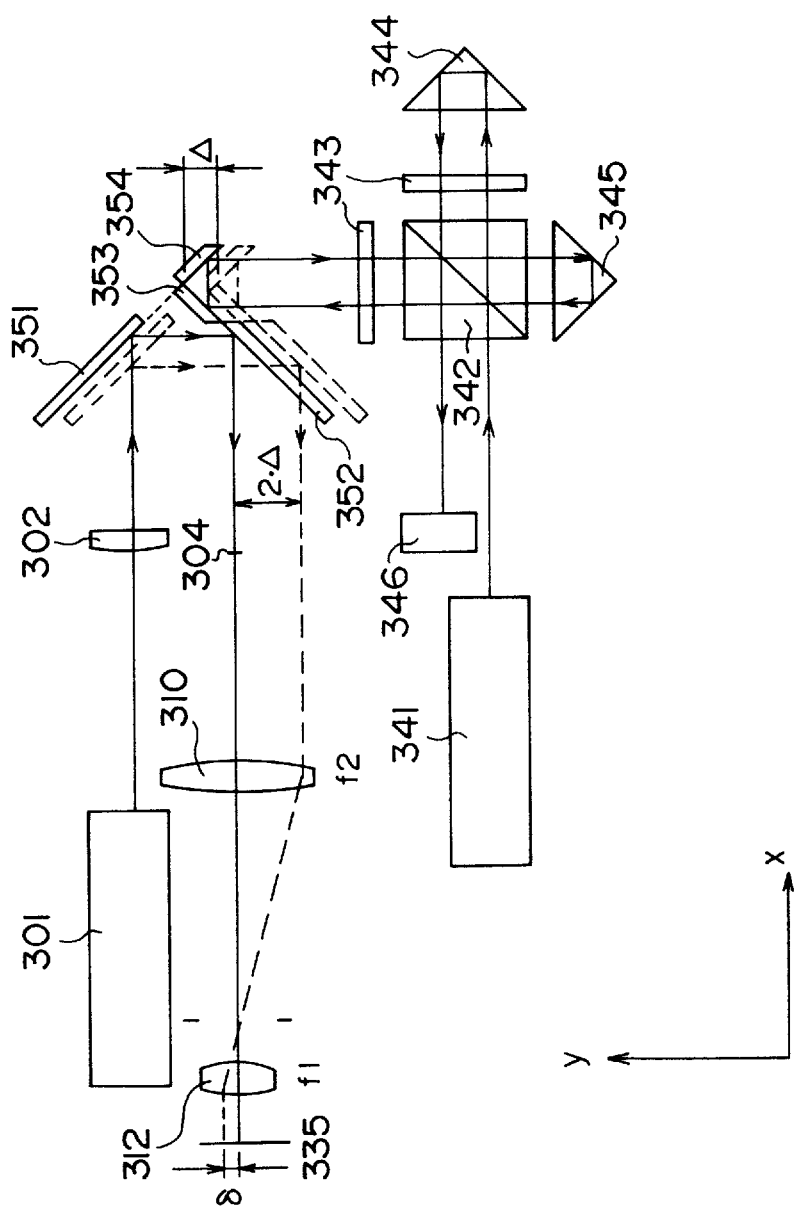
FIG. 16 is a drawing showing the constitution and principle of actions of a modified example for the movable reflection mirrors in the scanning optical system and interference optical system.

FIG. 16 is a drawing showing the constitution of the movable reflection mirror in the scanning optical system and that in the interference optical system in accordance with a modified example and the principle of actions of the scanning optical system and interference optical system in this modified example.

The constitutions of the scanning optical system and interference optical system in FIG. 16 are similar to those in FIG. 13. However, they are basically different from each other in that, whereas the scanning movable reflection mirror and the measuring movable reflection mirror are respectively the surface reflection mirror and the rear reflection mirror in FIG. 13, both of the movable reflection mirrors in FIG. 16 are the surface reflection mirrors.

In FIG. 16, the scanning movable reflection mirror comprises two reflective surfaces which are orthogonal to each other, i.e., a first reflective surface 351 and a second reflective surface 352. Also, the measuring movable reflection mirror comprises two reflective surfaces which are orthogonal to each other, i.e., a first reflective surface 353 and a second reflective surface 354.

They are constructed such that the line of intersection of the two reflective surfaces of the scanning optical system coincides with the line of intersection of the two reflective surfaces of the interference optical system.

Also, they are constructed such that the plane including the incident beam and emitted beam with respect to the scanning movable reflection mirror coincides with the plane including the incident beam and emitted beam with respect to the measuring movable reflection mirror. In other words, they are constructed such that the reflecting intersection of the scanning movable reflection mirror coincides with that of the measuring movable reflection mirror.

In this manner, since the rear reflection mirror is not used as the movable reflection mirror in the interference optical system shown in FIG. 16, the amount of movement Δ of the reflecting intersection of the scanning movable reflection mirror can be accurately determined [cf. equation (17)], not as a first-order approximation. As a result, the amount of movement of scan beam on the test surface can be correctly determined on the basis of thus accurately measured amount of movement Δ.

Figure 17:
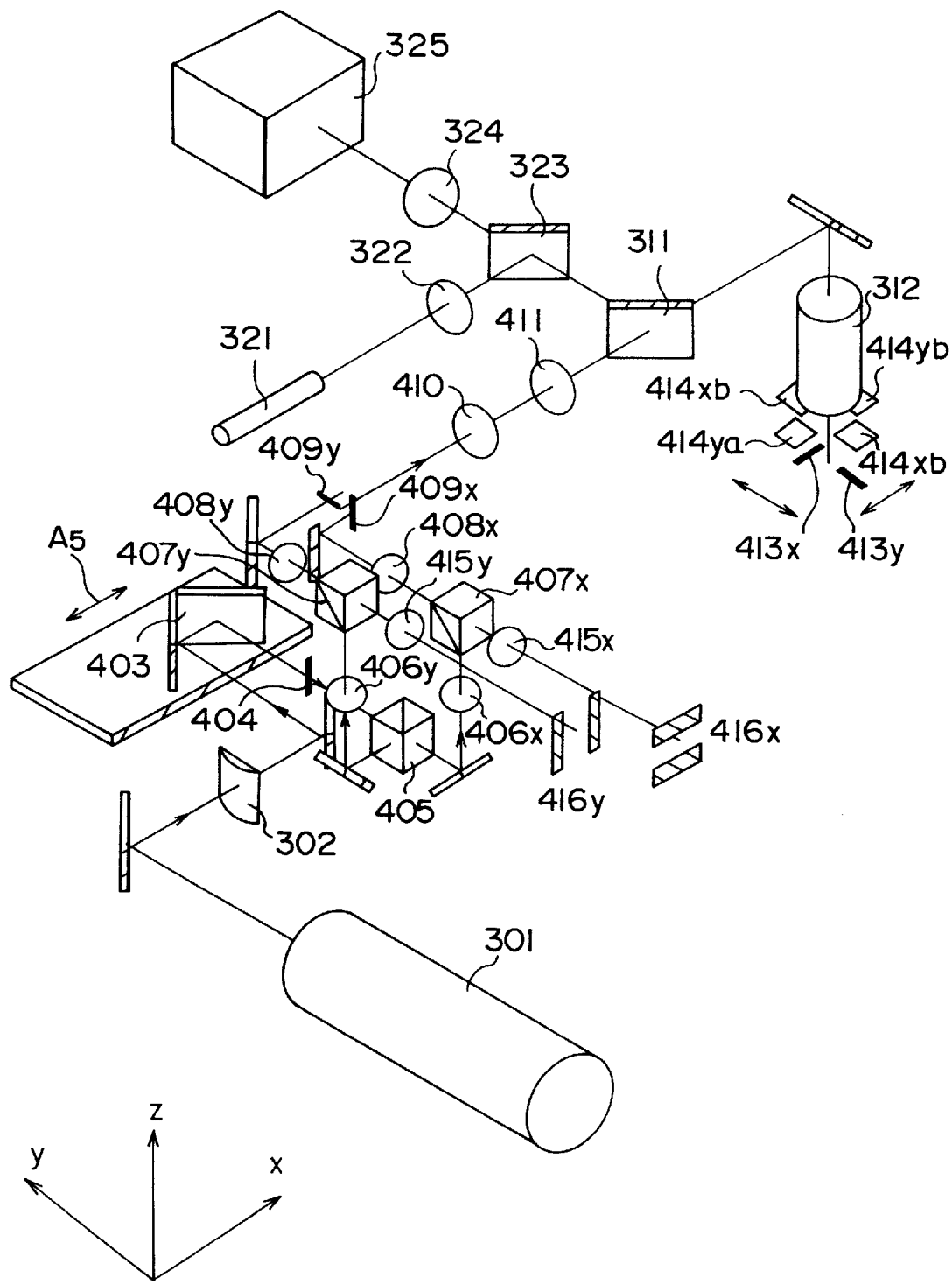
FIG. 17 is a perspective view schematically showing the constitution of a scanning optical apparatus in accordance with an embodiment of the present invention.

FIG. 17 is a perspective view showing the constitution of the scanning optical apparatus in accordance with another embodiment of the present invention.

In the scanning optical apparatus of FIG. 17, beam scanning in two directions orthogonal to each other on the test surface, i.e., concurrent two-dimensional scanning in xy-directions, can be performed. Such a concurrent two-dimensional scanning optical system can be applied to size-measuring apparatus, coordination-determining apparatus, alignment measurement, registration measurement, and the like.

Though the interference optical system is not depicted in the scanning optical apparatus of FIG. 17, an interference optical system having the same constitution as that of FIG. 15, for example, can be used therein. Also, the observation optical system in the depicted apparatus has the same constitution as that of FIG. 15. Further, the scanning optical system in the depicted apparatus has a constitution similar to that of FIG. 15. Accordingly, in FIG. 17, the elements having functions basically the same as those in FIG. 15 are indicated by the same reference marks.

In the following, the scanning optical system in the scanning optical apparatus of FIG. 17 will be explained taking into account its basic differences from the constitution of FIG. 15.

In the scanning optical system of FIG. 17, a beam emitted from a laser 301 becomes, by way of a cylindrical lens 302, a linear beam. The beam passing through the cylindrical lens 302 impinges on a movable reflection mirror 403 having two reflective surfaces which are orthogonal to each other, i.e., first and second reflective surfaces.

As in the case of the embodiment shown in FIG. 15, the movable reflection mirror 403 is fixed on a table, while the table and, accordingly, the movable reflection mirror 403 are reciprocatively movable in the direction indicated by an arrow $A_5$ in the drawing.

In this manner, the beam reflected by the movable reflection mirror 403 forms an image as a linear beam 404 due to the condensing action of the above-mentioned cylindrical lens 302. Also, the light from the linear beam 404 is divided into two beams by a polarizing beam splitter 405.

The first beam passing through the polarizing beam splitter 405 enters a polarizing beam splitter 407x by way of a relay lens 406x. On the other hand, the second beam reflected by the polarizing beam splitter 405 enters a polarizing beam splitter 407y by way of a relay lens 406y.

The first beam reflected by the polarizing beam splitter 407x passes through a relay lens 408x and then forms an image as a linear beam 409x whose longitudinal direction extends in the z-direction. Also, the second beam reflected by the polarizing beam splitter 407y passes through a relay lens 408y and then forms an image as a linear beam 409y whose longitudinal direction extends in the y-direction.

As depicted, the longitudinal directions of the two linear beams 409x and 409y are orthogonal to and spatially separated from each other. Namely, the centers of the two linear beams 409x and 409y are individually deviated from the optical axis of a second objective lens 410 which will be explained later. Both of the directions of polarization of the two linear beams 409x and 409y coincide with the longitudinal direction of the linear beam 409y.

The light components from the two linear beams 409x and 409y respectively form images on a test surface as linear beams 413x and 413y by way of the second objective lens 410, a ¼-wavelength plate 411, a dichroic mirror 311, and an objective lens 312.

As depicted, the linear beam 413x has a longitudinal direction extending in the x-direction, whereas the linear beam 413y has a longitudinal direction extending in the y-direction. Together with the reciprocative movement of the movable reflection mirror 403, the linear beam 413x is scanned in the y-direction while the linear beam 413y is scanned in the x-direction.

The scattered light components from the test surface with respect to the linear beam 413x are detected by detectors 414xa and 414xb. Also, the scattered light components from the test surface with respect to the linear beam 413y are detected by detectors 414ya and 414yb.

On the other hand, the first regularly reflected light component and first diffracted light component enter the polarizing beam splitter 407x by way of the objective lens 312, the dichroic mirror 311, the ¼-wavelength plate 411, the second objective lens 410, and the relay lens 408x. Also, the second regularly reflected light component and second diffracted light component enter the polarizing beam splitter 407y by way of the objective lens 312, the dichroic mirror 311, the ¼-wavelength plate 411, the second objective lens 410, and the relay lens 408y.

Since both of the directions of polarization of the regularly reflected light and diffracted light passing through the ¼-wavelength plate 411 coincide with the longitudinal direction of the linear beam 409x, the first regularly reflected light component and the first diffracted light component pass through the polarizing beam splitter 407x while the second regularly reflected light component and the second diffracted light component pass through the polarizing beam splitter 407y.

The first diffracted light component passing through the polarizing beam splitter 407x reaches, by way of a relay lens 415x, a spatial filter 416x, which is disposed at a position conjugate with the pupil surface of the objective lens 312, and then is photoelectrically detected. Also, the second diffracted light component passing through the polarizing beam splitter 407y reaches, by way of a relay lens 415y, a spatial filter 416y, which is disposed at a position conjugate with the pupil surface of the objective lens 312, and then is photoelectrically detected.

When the regularly reflected light is to be detected, it is photoelectrically detected by way of an opening (not depicted) such as a slit which is disposed at a position conjugate with the pupil surface of the objective lens 312.

In this manner, concurrent two-dimensional scanning in the x- and y-directions can be performed by a single scanning optical system. Also, since two scan beams are spatially separated from each other, two detected light components corresponding to the two scan beams are prevented from mingling with each other, thereby enabling rapid and highly accurate measurement. Also, loss in the amount of light due to the polarizing action can be minimized.

In the above-mentioned embodiment, a reflection mirror means having two reflective surfaces orthogonal to each other is used as the movable reflection means for the scanning optical system and interference optical system. However, a cube corner mirror having three reflective surfaces, which are orthogonal to each other, may be used. In this case, two sets of cube corner mirrors are preferably disposed such that their apexes overlap with each other. Alternatively, a reflective prism such as a rectangular prism may be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No.323924/1994, No.323927/1994 and No.323929/1994 all filed on Dec. 1, 1994 are hereby incorporated by reference.

What is claimed is:

1. An optical apparatus for optically scanning a first mark formed on a first substrate and a second mark formed on a second substrate so as to measure a positional deviation between said first and second substrates, said optical apparatus comprising:

a first optical system which is disposed between said first and second substrates and makes a position on said first substrate and a position on said second substrate conjugate with each other;

a first light source system for supplying a luminous flux;

a scan beam forming optical system which, based on the luminous flux supplied from said first light source system, forms a single line beam;

a scanning device for optically scanning said single line beam in directions different from each other, based on the beam generated in said beam forming optical system;

a dividing optical system for dividing said single line beam into a first scan beam and a second scan beam, based on the beam from said scanning device;

a deflecting optical system for deflecting said first and second scan beams divided in said dividing optical system, wherein said first and second scan beams scan simultaneously and independently;

combining optical system for spatially combining said first and second scan beams from said deflecting optical system;

a first detection device which detects a light component from said first mark generated by the optical scanning of said first substrate with said first scan beam and a light component from said second mark generated by the optical scanning of said second substrate with said first scan beam passing through said first optical system; and a second detection device which detects a light component from said first mark generated by the optical scanning of said first substrate with said second scan beam and a light component from said second mark generated by the optical scanning of said second substrate with said second scan beam passing through said first optical system.

2. The optical apparatus according to claim 1, wherein said first scan beam is deflected in a scanning direction of a stage on which said first substrate is mounted and said second scan beam is deflected in a direction perpendicular to the scanning direction of the stage.

3. An optical apparatus according to claim 2, wherein said scan beam forming optical system comprises a polarization separating device for generating two luminous fluxes which are spatially separated from each other and have polarizing conditions different from each other.

4. An optical apparatus according to claim 2, wherein said scanning optical system comprises a first movable reflection member which has at least two reflective surfaces orthogonal to each other for emitting, with a polarization of 180 degrees, the luminous flux input from said first light source system and parallelly dislocates the emitted luminous flux in a predetermined direction and said optical system further comprises a measuring device for measuring an amount of movement, in said predetermined direction, of a point of intersection between a line of intersection formed by at least two of said reflective surfaces of said first movable reflection member and a plane including the luminous flux incident on said first movable reflection member and the luminous flux emitted from said first movable reflection member.

5. An optical apparatus according to claim 4, wherein said measuring device comprises:

a second light source system for supplying a measuring luminous flux;

a second movable reflection member which has at least two reflective surfaces orthogonal to each other for emitting, with a polarization of 180 degrees, the measuring luminous flux input from said second light source system and is movable in said predetermined direction together with said first movable reflection member; and a movement amount measuring means for measuring, based on change in optical path length in said measuring luminous flux generated due to movement of said second movable reflection member, an amount of movement, in said predetermined direction, of a point of intersection between a line of intersection formed by at least two of said reflective surfaces of said second movable reflection member and a plane including the luminous flux incident on said second movable reflection member and the luminous flux emitted from said second movable reflection member.

6. An optical apparatus according to claim 5, wherein the point of intersection of said second movable reflection member substantially coincides with the point of intersection of said first movable reflection member.

7. An optical apparatus according to claim 4, wherein said measuring device has an encoder for detecting said amount of movement mechanically.

8. An optical apparatus according to claim 2, wherein a pattern is formed on said first substrate;

said first and second substrates are relatively movable with respect to said first optical system; and due to the relative movement, the pattern on said first substrate projectively impinges on and is transferred to said second substrate, which is a photosensitive substrate, by way of said first optical system.

9. An optical apparatus according to claim 8, wherein said first optical system has a plurality of projection optical units arranged in a direction perpendicular to a direction of movement of said first and second substrates and said first and second scan beams are formed in a visual field area, on said first substrate, of one of said projection optical units.

10. An optical apparatus according to claim 9, wherein said scan beam forming optical system forms both of said first and second scan beams in a visual field area of the projection optical unit disposed at an end of said plurality of projection optical units arranged in a direction perpendicular to a direction of movement of said first and second substrates, while forming both of said first and second scan beams in a visual field area of the projection optical unit disposed at the other end.

11. An optical apparatus according to claim 9, wherein said first and second detection devices successively detect, during movement of said first and second substrates, light components from a plurality of said first marks formed on said first substrate in the direction of movement thereof and light components from a plurality of said second marks formed on said second substrate in the direction of the movement thereof.

12. An optical apparatus comprising:

a first light source system for supplying a luminous flux;

a condenser optical system for converging the luminous flux from said first light source system on a test surface in which a pattern has been formed;

a first movable reflection member which is disposed between said first light source system and said condenser optical system, said first movable reflection member having at least two reflective surfaces orthogonal to each other by which the luminous flux input from said first light source system is emitted with a polarization of 180 degrees and parallelly dislocating the emitted luminous flux in a predetermined direction so as to optically scan said test surface with the luminous flux thereon;

a measuring device for measuring an amount of movement, in said predetermined direction, of a point of intersection between a line of intersection formed by at least two of said reflective surfaces of said first movable reflection member and a plane including the luminous flux incident on said first movable reflection member and the luminous flux emitted from said first movable reflection member, said measuring device forming a scanning device together with said first movable reflection member;

a detection device for detecting a light component from the pattern on said test surface generated when said scanning apparatus optically scans said test surface with the luminous flux converged thereon;

a two-luminous-flux generating device which is disposed in an optical path between said scanning device and said condenser optical system and generates, based on the luminous flux emitted from said first movable reflection member, two scanning luminous fluxes on said test surface which are separated from each other and have polarizing conditions different from each other; and two openings disposed at positions conjugate with said test surface, said detection device photoelectrically detecting, respectively by way of said two openings, the two luminous fluxes from the pattern on said test surface passing through said condenser optical system, said two-luminous-flux generating device, and said first movable reflection member.

13. An optical apparatus according to claim 12, wherein said measuring device comprises:

a second light source system for supplying a measuring luminous flux;

a second movable reflection member which has at least two reflective surfaces orthogonal to each other for emitting, with a polarization of 180 degrees, the measuring luminous flux input from said second light source system and is movable in said predetermined direction together with said first movable reflection member; and a movement amount measuring means for measuring, based on change in optical path length in the luminous flux from said second light source system generated due to movement of said second movable reflection member, an amount of movement, in said predetermined direction, of a point of intersection between a line of intersection formed by at least two of said reflective surfaces of said second movable reflection member and a plane including the luminous flux incident on said second movable reflection member and the luminous flux emitted from said second movable reflection member.

14. An optical apparatus according to claim 13, wherein the point of intersection of said second movable reflection member substantially coincides with the point of intersection of said first movable reflection member.

15. An optical apparatus according to claim 13, wherein said first movable reflection member is a surface reflection mirror having two reflective surfaces orthogonal to each other, while said second movable reflection member is a rear reflection mirror having two reflective surfaces orthogonal to each other, at least one of the two reflective surfaces of said second movable reflection member substantially coinciding with one of the two reflective surfaces of said first movable reflection member, while the other of the two reflective surfaces of said second movable reflection member being within substantially the same plane with the other of the two reflective surfaces of said first movable reflection member.

16. An optical apparatus according to claim 15, further comprising a light-shielding member which is disposed between the two reflective surfaces of said second movable reflection member and cuts off the reflected light component from a front surface of said second movable reflection member.

17. An optical apparatus according to claim 16, wherein, when thickness of a member constituting the reflective surface of said second movable reflection member is taken as d and diameter of the luminous flux incident on said second movable reflection member is taken as $\Phi$, the following equation is substantially satisfied:

$$d > 1.3\Phi$$

18. An optical apparatus according to claim 12, wherein said measuring device has an encoder for detecting said amount of movement mechanically.

19. An optical apparatus according to claim 12, wherein said condenser optical system comprises:

two objective lenses which, as a whole, constitute an afocal system and an image-rotating optical system which is disposed between said two objective lenses.

20. An optical apparatus according to claim 12, further comprising a two-luminous-flux generating device which is disposed in an optical path between said scanning device and said condenser optical system and generates, based on the luminous flux emitted from said first movable reflection member, two scanning luminous fluxes on said test surface which are separated from each other and have polarizing conditions different from each other.

21. The optical apparatus according to claim 2, wherein said first and second detection devices comprises means for receiving each beam, and said means is located between said dividing optical system and said combining optical system.

* * * * *